(12) United States Patent
Sano et al.

(10) Patent No.: US 8,168,974 B2
(45) Date of Patent: *May 1, 2012

(54) FIELD EFFECT TRANSISTOR

(75) Inventors: Masafumi Sano, Yokohama (JP);
Katsumi Nakagawa, Zama (JP); Hideo Hosono, Yokohama (JP); Toshio Kamiya, Yokohama (JP); Kenji Nomura, Yokohama (JP)

(73) Assignees: Canon Kabushiki Kaisha, Tokyo (JP);
Tokyo Institute of Technology, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/882,647

(22) Filed: Sep. 15, 2010

(65) Prior Publication Data

US 2011/0012107 A1 Jan. 20, 2011

Related U.S. Application Data

(62) Division of application No. 11/269,647, filed on Nov. 9, 2005, now Pat. No. 7,868,326.

(30) Foreign Application Priority Data

Nov. 10, 2004 (JP) .................................. 2004-326683

(51) Int. Cl.
*H01L 31/20* (2006.01)
(52) U.S. Cl. ................ 257/58; 257/56; 257/59; 257/62; 257/72; 257/E29.083; 257/E29.092; 257/E29.101
(58) Field of Classification Search ..................... 257/43, 257/52, 55, 56, 57, 58, 59, 62, 72, E29.083, 257/E29.092, E29.101
See application file for complete search history.

(56) References Cited

U.S. PATENT DOCUMENTS

| 5,858,120 | A | 1/1999 | Nakagawa et al. | 136/256 |
| 6,075,256 | A | 6/2000 | Kaifu et al. | 257/53 |
| 6,563,174 | B2 | 5/2003 | Kawasaki et al. | |
| 7,205,640 | B2 | 4/2007 | Yoshioka et al. | 257/646 |
| 7,791,072 | B2 | 9/2010 | Kumomi et al. | 257/59 |
| 7,868,326 | B2 * | 1/2011 | Sano et al. | 257/58 |
| 2003/0218222 | A1 | 11/2003 | Wager et al. | 257/410 |
| 2004/0084736 | A1 | 5/2004 | Harada | 257/410 |

(Continued)

FOREIGN PATENT DOCUMENTS

| EP | 1 443 130 A1 | 8/2004 |
| JP | 05-251705 | 9/1993 |
| JP | 08-032094 | 2/1996 |

(Continued)

OTHER PUBLICATIONS

K. Nomura et al., "Electron transport in $InGaO_3(ZnO)_m$ m (m=integer) studied using single-crystalline thin film and transparent MISFETs," Thin Solid Films, 445, pp. 322-326 (2003).

(Continued)

*Primary Examiner* — Minchul Yang
(74) *Attorney, Agent, or Firm* — Fitzpatrick, Cella, Harper & Scinto

(57) ABSTRACT

A novel field-effect transistor is provided which employs an amorphous oxide. In an embodiment of the present invention, the transistor comprises an amorphous oxide layer containing electron carrier at a concentration less than $1 \times 10^{-18}/cm^3$, and the gate-insulating layer is comprised of a first layer being in contact with the amorphous oxide and a second layer different from the first layer.

24 Claims, 9 Drawing Sheets

U.S. PATENT DOCUMENTS

| | | | |
|---|---|---|---|
| 2004/0127038 A1 | 7/2004 | Carcia et al. | 438/689 |
| 2005/0039670 A1 | 2/2005 | Hosono et al. | |
| 2005/0173734 A1 | 8/2005 | Yoshioka et al. | 257/202 |
| 2005/0199959 A1 | 9/2005 | Chiang et al. | 257/368 |
| 2006/0108529 A1 | 5/2006 | Saito et al. | 250/338.4 |
| 2006/0110867 A1 | 5/2006 | Yabuta et al. | 438/151 |
| 2006/0113536 A1 | 6/2006 | Kumomi et al. | 257/57 |
| 2006/0113549 A1 | 6/2006 | Den et al. | 257/79 |
| 2006/0113565 A1 | 6/2006 | Abe et al. | 257/197 |

FOREIGN PATENT DOCUMENTS

| | | |
|---|---|---|
| JP | 2000-44236 | 2/2000 |
| JP | 2002-289859 | 4/2002 |
| JP | 2003-50405 A | 2/2003 |
| JP | 2003-86808 A | 3/2003 |
| JP | 2003-222890 A | 8/2003 |
| JP | 2003-298062 | 10/2003 |
| JP | 2004-103957 | 4/2004 |
| JP | 2004-103957 A | 4/2004 |
| WO | WO 03/098699 | 11/2003 |
| WO | WO 2004038757 | 5/2004 |
| WO | WO 2005088726 | 9/2005 |
| WO | WO 2005093846 | 10/2005 |
| WO | WO 2005093847 | 10/2005 |
| WO | WO 2005093848 | 10/2005 |
| WO | WO 2005093849 | 10/2005 |
| WO | WO 2005093850 | 10/2005 |
| WO | WO 2005093851 | 10/2005 |
| WO | WO 2005093852 | 10/2005 |
| WO | WO 2006051993 | 5/2006 |
| WO | WO 2006051994 | 5/2006 |
| WO | WO 2006051995 | 5/2006 |

OTHER PUBLICATIONS

M. Orita et al., "Amorphous transparent conductive oxide InGaO3(Zno)m(m<=4): a Zn 4s conductor," Philosophical Magazine B, 81, No. 5, pp. 501-515 (2001).

Canadian Office Action issued on Jan. 6, 2010, in the counterpart Canadian Application No. 2,585,071.

International Preliminary Report on Patentability mailed Nov. 14, 2006, in the counterpart PCT application No. PCT/JP2005/020982.

Narushima et al., "A p-Type Amorphous Oxide Semiconductor and Room Temperature Fabrication of Amorphous Oxide p-n Heterojunction Diodes", *Advanced Materials*, vol. 15, No. 17, pp. 1409-1413 (2003).

Nomura et al., "Room-temperature Fabrication of Transparent Flexible Thin-film Transistors Using Amorphous Oxide Semiconductors," *Nature*, vol. 432, 488-492 (2004).

Takagi et al., "Carrier Transport and Electronic Structure in Amorphous Oxide Semiconductor, a-InGaZnO$_4$," *Thin Solid Films*, vol. 486, 38-41 (2005).

Nomura et al., "Thin-Film Transistor Fabricated in Single-Crystalline Transparent Oxide Semiconductor," *Science*, vol. 300, 1269-1272 (2003).

Nomura et al., "Carrier Transport in Transparent Amorphous Oxide Semiconductor InGaZnO$_4$", Preprint 31a-ZA-6 of 51th Meeting of Union of Applied Phys. Soc., Mar. 2004, Tokyo University of Technology.

Kamiya et al., "Room Temperature Fabrication and Carrier Transport . . . (>10 cm$^2$/Vs)", Preprint 1a-F-5 of 65$^{th}$ Meeting of Appl. Phys. Soc., Sep. 2004, Tohoku Gakuen University.

Fortunato, "Wide Bandgap High Mobility ZnO Thin Film Transistors Produced at Room Temperature", Appl. Phys. Lee., 85, 2004, pp. 2541-2543.

Office Action in Japanese Application No. 2005-325371 (Jan. 11, 2012) (13 pages).

Kamiya et al. (2004), "Room temperature fabrication and carrier transport of amorphous semiconductor exhibiting large electron Hall mobilities > 10 cm2/Vs," Proceedings of the 65th Autumn Meeting of the Japan Society of Applied Physics, Tohoku Gakuin University (4 pages).

* cited by examiner

FIELD EFFECT TRANSISTOR

CROSS-REFERENCE TO RELATED APPLICATION

This application is a division of U.S. patent application Ser. No. 11/269,647, filed on Nov. 9, 2005, now U.S. Pat. No. 7,868,326, which claims the benefit of Japanese Patent Application No. 2004-326683, filed on Nov. 10, 2004. The contents of the aforementioned applications are incorporated herein by reference in their entireties.

BACKGROUND OF THE INVENTION

1. Field of the Invention

The present invention relates to a field effect transistor employing an amorphous oxide.

2. Related Background Art

In recent years, flat panel display (FPD) is commercialized as the results of progress of liquid crystal techniques, electroluminescence (EL), and the related techniques. The FPD is driven by an active matrix circuit comprising a field-effect thin film transistor (TFT) employing an amorphous silicon thin film or polycrystalline silicon thin film as the active layer formed on a glass substrate.

For smaller thickness, lighter weight, and higher impact strength of the FPD, use of a lightweight and a flexible resin substrate is investigated in place of the glass substrate. However, the transistor employing the silicon thin film cannot by directly formed on a less heat-resistant resin substrate, since the production of the silicon thin film transistor requires a relatively high-temperature in the process, Therefore, for the TFT, use of an oxide semiconductor thin film such as a ZnO thin film is actively investigated which enables film formation at a lower temperature (Japanese Patent Application Laid-Open No. 2003-298062).

However, a transistor has not been obtained which satisfies simultaneously all of the properties of transparency and electric properties of the TFT, properties of the gate-insulating film, prevention of current leakage, and adhesiveness between the active layer and the substrate.

SUMMARY OF THE INVENTION

The present invention intends to provide a novel field effect transistor employing an amorphous oxide.

The present invention intends further to obtain a transistor which is excellent in at least one of the properties of transparency and electric properties of the TFT, properties of the gate-insulating film, prevention of current leakage, and adhesiveness between the active layer and the substrate.

According to the first aspect of the present invention, there is provided a field-effect transistor provided with a source electrode, a drain electrode, a gate insulator, a gate electrode, and an active layer:

the active layer being comprised of an amorphous oxide in which an electron carrier concentration is lower than $10^{18}/cm^3$, or an amorphous oxide in which an electron mobility tends to increase with increase of the electron carrier concentration; and at least one of the source electrode, the drain electrode and the gate electrode is transparent to visible light.

The field-effect transistor preferably has a metal wiring connected to at least one of the source electrode, the drain electrode and the gate electrode.

The amorphous oxide is preferably an oxide containing at least one of In, Zn, and Sn, or an oxide containing In, Zn, and Ga.

According to the second aspect of the present invention, there is provided a field-effect transistor provided with a source electrode, a drain electrode, a gate insulator, a gate electrode, and an active layer:

the active layer being comprised of an amorphous oxide in which an electron carrier concentration is less than $10^{18}/cm^3$, or an amorphous oxide in which an electron mobility tends to increase with increase of the electron carrier concentration; and having a lamination structure comprised of a first layer in which at least one of the source electrode, the drain electrode and the gate electrode is transparent to visible light, and a second layer composed of a metal, or having a lamination structure comprised of a first layer in which a wiring connected at least one of the source electrode, the drain electrode and the gate electrode is transparent to visible light, and a second layer composed of a metal.

According to the third aspect of the present invention, there is provided a field-effect transistor provided with a source electrode, a drain electrode, a gate-insulating film, a gate electrode, and an active layer, wherein the active layer is comprised of an amorphous oxide transparent to visible light, and at least one of the source electrode, the drain electrode, and the gate electrode is transparent to visible light.

The transistor is preferably a normally-off type transistor, using the active layer.

A metal wiring is preferably connected to an electrode transparent to light which belongs to the source electrode, the drain electrode or the gate electrode.

According to the fourth aspect of the present invention, there is a field-effect transistor provided with a source electrode, a drain electrode, a gate-insulating film, a gate electrode, and an active layer:

the active layer being comprised of an amorphous oxide in which an electron carrier concentration is lower than $10^{18}/cm^3$, and the gate-insulating film is comprised of a first layer being in contact with the amorphous oxide and a second layer different from the first layer and is laminated on the first layer.

The first layer is preferably an insulating layer comprising $HfO_2$, $Y_2O_3$, or a mixed crystal compound containing $HfO_2$ or $Y_2O_3$.

The amorphous oxide is preferably an oxide containing at least one of In, Zn, and Sn, or an oxide containing In, Zn, and Ga.

The first layer is preferably an interface improvement layer for improving an interfacial property with the active layer, and the second layer is a current leakage prevention layer for preventing leakage of electric current.

According to the fifth aspect of the present invention, there is provided a field effect transistor provided with a source electrode, a drain electrode, a gate insulator, a gate electrode, and an active layer, the active layer being comprised of an amorphous oxide, and the gate insulator is comprised of a first layer being in contact with the amorphous oxide and a second layer different from the first layer and is laminated on the first layer.

The amorphous oxide is preferably any one selected from the group consisting of an oxide containing In, Zn and Sn; an oxide containing In and Zn; an oxide containing In and Sn; and an oxide containing In.

The transistor is preferably a normally-off type transistor.

According to the sixth aspect of the present invention, there is provided a field-effect transistor provided with a source electrode, a drain electrode, a gate-insulating film, a gate electrode, and an active layer:

the active layer being comprised of an amorphous oxide in which an electron carrier concentration is less than $10^{18}/cm^3$, or an amorphous oxide in which an electron mobility tends to increase with increase of the electron carrier concentration; and a passivation layer is provided between the active layer and the gate-insulating layer.

The amorphous oxide is preferably an oxide containing at least one of In, Zn, and Sn, or an oxide containing In, Zn, and Ga.

The passivation layer is preferably a current leakage prevention layer for preventing leakage of electric current.

According to the seventh aspect of the present invention, there is provided a field effect transistor provided with a source electrode, a drain electrode, a gate insulator, a gate electrode, and an active layer, the active layer being comprised of an amorphous oxide; and a passivation layer being provided between the active layer and the gate insulator.

According to the eighth aspect of the present invention, there is provided a field-effect transistor provided with a source electrode, a drain electrode, a gate-insulating film, a gate electrode, and an active layer on a substrate:

the active layer being comprised of an amorphous oxide in which an electron carrier concentration is less than $10^{18}/cm^3$, or an amorphous oxide in which an electron mobility tends to increase with increase of the electron carrier concentration; and a surface-coating layer being provided between the active layer and the substrate.

The amorphous oxide is preferably an oxide containing at least one of In, Zn, and Sn, or an oxide containing In, Zn, and Ga.

The surface-coating layer is preferably an adhesion-improvement layer for improving the adhesiveness between the substrate and the active layer.

According to the ninth aspect of the present invention, there is provided a field effect transistor provided with a source electrode, a drain electrode, a gate insulator, a gate electrode, and an active layer, the active layer being comprised of an amorphous oxide; and a surface-coating layer being provided between the active layer and the substrate.

As the results of investigation on the oxide semiconductors by the inventors of the present invention, it was found that the above-mentioned ZnO is formed in a state of a polycrystalline phase, causing scattering of carriers at the interface between the polycrystalline grains to lower the electron mobility. Further it was found that ZnO is liable to cause oxygen defect therein to produce many carrier electrons, which makes difficult to lower the electrical conductivity. Thereby, even when a gate voltage is not applied to the transistor, a large electric current flow is caused between the source terminal and the drain terminal, making impossible the normally-off state of the TFT and a larger on-off ratio of the transistor.

The inventors of the present invention investigated the amorphous oxide film $Zn_xM_yIn_zO_{(x+3y/2+3z/2)}$ (M: at least one element of Al and Ga) mentioned in Japanese Patent Application Laid-Open No. 2000-044236. This material contains electron carriers at a concentration not less than $1\times10^{18}/cm^3$, and is suitable as a simple transparent electrode. However, the oxide containing the electron carrier at a concentration of not less than $1\times10^{18}/cm^3$ used in a channel layer of TFT cannot give a sufficient on-off ratio, and is not suitable for the normally-off TFT. Thus a conventional amorphous oxide film cannot provide a film of a carrier concentration of less than $1\times10^{18}/cm^3$.

The inventors of the present invention prepared a TFT by use of an amorphous oxide of a carrier concentration of less than $1\times10^{18}/cm^3$ as an active layer of a field-effect transistor. The TFT was found to have desired properties and to be useful for an image display apparatus like a light emission apparatus.

Further, the inventors of the present invention investigated a material $InGaO_3(ZnO)_m$ and the film forming conditions of this material, and found that the carrier concentration of this material can be controlled to be less than $1\times10^{18}/cm^3$ by controlling the oxygen atmosphere conditions in the film formation.

According to the present invention, a novel field-effect transistor is provided by using an amorphous oxide as the active layer.

DETAILED DESCRIPTION OF THE INVENTION

Figure 1:
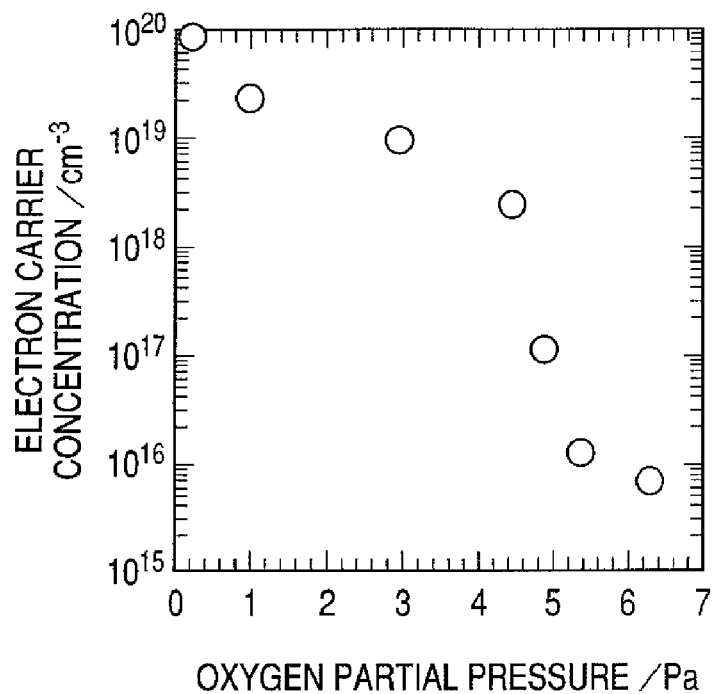
FIG. 1 is a graph showing a dependency of carrier concentration in the In—Ga—Zn—O type amorphous oxide formed by a pulse laser vapor deposition process on the oxygen partial pressure during film formation.

Firstly the construction of the active layer of the field effect transistor of the present invention is described.

The inventors of the present invention found that some kinds of amorphous thin films of semi-insulating oxides have characteristics that the electron mobility therein increases with increase in number of conduction electrons, and further found further that a TFT prepared by use of such a film has improved transistor characteristics such as the on-off ratio, the saturation current in a pinch-off state, and the switching rate.

By use of the transparent semi-insulating thin film as the channel layer of a film transistor, the current between the drain terminal and the source terminal in an off-state (no gate voltage applied) can be controlled to be less than 10 microamperes, preferably less than 0.1 microamperes for the electron mobility of higher than 1 cm$^2$/V·sec, preferably higher than 5 cm$^2$/V·sec and at the carrier concentration of less than $1\times10^{18}$/cm$^3$, preferably less than $1\times10^{16}$/cm$^3$. Further by use of this thin film, the saturation current after pinch-off can be increased to 10 microampere or more and the on-off ratio can be raised to be higher than $1\times10^3$ for the electron mobility higher than 1 cm$^2$/V·sec, preferably higher than 5 cm$^2$/V·sec.

In a pinch-off state of the TFT, a high voltage is being applied to the gate terminal, and electrons are existing in a high density in the channel. Therefore, according to the present invention, the saturation current can be increased in correspondence with the increase of the electron mobility. Thereby, the nearly all of the transistor characteristics are improved such as increase of the on-off ratio, increase of the saturation current, and increase of the switching rate. In contrast, in a usual compound, the increase in number of electrons decreases the electron mobility owing to collision between the electrons.

The structure of the aforementioned TFT may be a stagger (top gate) structure in which a gate-insulating film and a gate terminal are formed successively on a semiconductor channel layer, or a reversed stagger (bottom gate) structure in which a gate-insulating film and a semiconductor channel layer are formed successively on a gate terminal.

A specific example of the amorphous oxide constituting the active layer is an oxide containing In—Ga—Zn—O, represented by InGaO$_3$(ZnO)$_m$ (m: a natural number of less than 6) in a crystal state. Another example is an oxide containing In—Ga—Zn—Mg—O, represented by InGaO$_3$(Zn$_{1-x}$Mg$_x$O)$_m$ (m: a natural number of less than 6; 0<x≦1), containing electron carriers at a concentration of less than $1\times10^{18}$/cm$^3$.

The amorphous oxide films exhibit preferably an electron mobility of higher than 1 cm$^2$/V·sec.

It was found that, by use of the above film as the channel layer, a TFT can be prepared which is normally-off with a gate current of less than 0.1 microampere in a transistor off-state, having an on-off ratio of higher than $1\times10^3$, and being transparent to visible light and flexible.

In the above transparent film, the electron mobility increases with the increase in number of the conductive electrons. The substrate for forming the transparent film includes glass plates, plastic plates, and plastic films.

In a preferred embodiment employing the above transparent oxide film as the channel layer, a transistor is prepared by forming an electrode layer from at least one of layers constituted of SnO$_2$, In$_2$O$_3$, ITO, Tl$_2$O$_3$, TlOF, SrTiO$_3$, EuO, TiO, or VO as the transparent electrode.

In another preferred embodiment employing the above transparent oxide film as the channel layer, a transistor is prepared by forming an electrode layer from at least one of layers constituted of Au, Ag, Al, or Cu as the electrode.

In still another preferred embodiment employing the above transparent oxide film as the channel layer, a transistor is prepared by forming a gate insulator from at least one of layers constituted of Y$_2$O$_3$ or HfO$_2$, a mixed crystal compound thereof, or SiO$_2$, Si$_3$N$_4$, TiO$_2$, Ta$_2$O$_5$, PbTiO$_3$, BaTa$_2$O$_6$, SrTiO$_3$, MgO, or AlN, or an amorphous matter thereof.

In a still another preferred embodiment, the film is formed in an oxygen gas-containing atmosphere without intentional addition of an impurity for increasing the electric resistance.

The process for producing the amorphous oxide film, and the process for producing TFT employing the amorphous oxide are explained more specifically after the description of the first to third embodiments.

The constitutional requirements other than the active layer of the field effect transistor are explained for first to ninth aspects of the present invention by classifying into first to third embodiments.

For the following first to third embodiments, it is preferable to use such an active layer, electrode, gate insulator material and the like as described above. However, the invention of the following embodiments is not limited to the above active layer and the like.

FIRST EMBODIMENT

Transparent S, D, G Electrodes or Laminated Electrodes

The field-effect transistor of this embodiment belongs to the category of the aforementioned first, second, and third aspects of the invention.

The description "transparent to visible light" signifies a state in which the material is transparent to at least a part of the visible light wavelength region. The transparency signifies a state of not only no light absorption but also penetration of a part of the visible light. In the present invention, the transmittance of visible light is not lower than 40%, more preferably not lower than 60%, still more preferably not lower than 80%.

Thus, a highly transparent device is realized by making transparent at least a portion of the electrode or another member constituting the transistor.

Desirably, all of the source electrode, the drain electrode, the gate electrode, and the gate-insulating film are transparent to the visible light.

Examples of electrodes transparent to visible light are those formed from SnO$_2$, In$_2$O$_3$, ITO, Tl$_2$O$_3$, TlOF, SrTiO$_3$, EuO, TiO, or VO.

Generally, an electrode material transparent to visible light has a low electric conductivity, or a high electric resistance. Therefore, a display device which has wiring formed entirely from such an electrode material will have a high parasitic resistance. Therefore, the wiring is constituted of lamination of a first layer formed from a material transparent to the visible light and a second layer formed from gold, copper, aluminum, or a like metal or alloy containing the metal. Specifically, for instance, the transparent first layer is used around the transistor, other portion is formed by lamination of the first layer and the second layer, and the lead-wiring is formed by the second layer having a high electrical conductivity, whereby the parasitic resistance can be decreased. Naturally the aforementioned source electrode, drain electrode, or gate electrode itself may be formed by the lamination structure.

The active layer of the field-effect transistor of the third aspect of the present invention is constituted of the amorphous oxide transparent to visible light as mentioned above. This active layer constitutes preferably a normally-off type transistor.

In view of the invention of the first aspect, according to the third aspect of the present invention, the active layer is formed from an amorphous oxide which contains the carriers at a concentration of not less than $1\times10^{18}/cm^3$, not tending to increase the electron mobility with increase of the carrier concentration, and being transparent to visible light, and at least one of the source electrode, drain electrode, and gate electrode is transparent to visible light.

Thus, a device having a broader region of transparency can be produced by making transparent at least a part of the electrodes or other members constituting the transistor.

SECOND EMBODIMENT

Multilayered Gate Insulator

The field-effect transistor of this embodiment belongs to the category of the above fourth and fifth aspects of the invention. The active layer of this embodiment is preferably constituted of an transparent amorphous oxide containing at least In—Ga—Zn—O, represented by $InGaO_3(ZnO)_m$ (m: a natural number of less than 6) in a crystal state, containing carriers at a concentration of less than $1\times10^{18}/cm^3$; or a transparent amorphous oxide containing In—Ga—Zn—Mg—O, represented by $InGaO_3(Zn_{1-x}Mg_xO)_m$ (m: a natural number of less than 6; $0<x\leq1$) in a crystal state.

The first layer constituting the gate-insulating film is constituted of, for example, $HfO_2$ or $Y_2O_3$, or a mixed crystal compound thereof. The second layer is constituted, for example, of $SiO_2$, $Si_3N_4$, $TiO_2$, $Ta_2O_5$, $PbTiO_3$, $BaTa_2O_6$, $SrTiO_3$, MgO, or AlN, or an amorphous structure containing the above substance.

The above materials of the first layer and the second layer are examples, and the materials of the first and the second layers may be used respectively for the second and the first layers.

$HfO_2$ and $Y_2O_3$ are excellent material having a high current driving ability owing to the high dielectric constant. According to the knowledge of the inventors, use of the $HfO_2$ or $Y_2O_3$ as the gate-insulating film in combination with the channel layer constituted of $InGaO_3(ZnO)_m$ or $InGaO_3(Zn_{1-x}Mg_xO)_m$ gives a TFT exhibiting a remarkably high mobility and a low threshold. The mechanism thereof is not known, but presumably the $HfO_2$ or $Y_2O_3$ forms an excellent interface with $InGaO_3(ZnO)_m$ or $InGaO_3(Zn_{1-x}Mg_xO)_m$ to serve to improve the interfacial properties.

Figure 5:
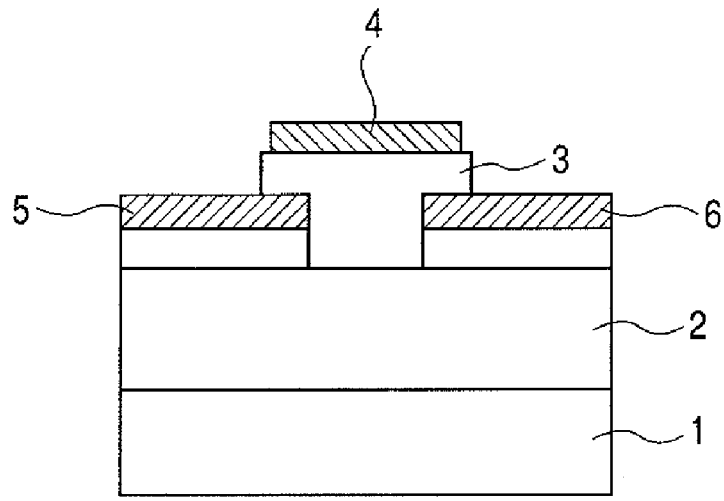
FIG. 5 illustrates schematically a structure of a top gate type TFT element prepared in Examples 6-10.

The gate-insulating film is further required not to cause gate leakage. The gate leakage is liable to occur at a level-difference portion at the end of source electrode 6 and drain electrode 5 as shown in FIG. 5. Therefore, the thickness of gate-insulating layer 3 is preferably equal to the thickness of source electrode 6 and drain electrode 5, or twice the thickness thereof.

However, since the Hf and Y are expensive, the thick gate-insulating film of $HfO_2$ or $Y_2O_3$ becomes a serious factor of cost increase in production of a large-area TFT panel.

On the other hand, $HfO_2$ or $Y_2O_3$ is capable of forming a satisfactory interface with an amorphous oxide such as $InGaO_3(ZnO)_m$ or $InGaO_3(Zn_{1-x}Mg_xO)_m$. Therefore, such a gate-insulating film is used only around the interface with the channel layer, and thereon a second gate-insulating layer is formed from an inexpensive material such as $SiO_2$ and $Al_2O_3$ in the predetermined thickness. That is, the second gate electrode serves as a current leakage-preventing layer.

In such a manner, the gate leakage can be prevented effectively while the excellent interfacial property of $HfO_2$ or $Y_2O_3$ is sufficiently utilized. Therefore, according to the present invention, even with a smaller amount of Hf or Y, a TFT can be obtained which exhibits a high mobility, a low threshold, and yet has high reliability without gate leakage. Thus the aforementioned constitution is particularly suitable for a large-area TFT panel in view of the high performance and low production cost.

According to the knowledge of the inventors, a problem can arise when an electroconductive layer or the like is formed or etching is conducted on the surface of the channel layer constituted of $InGaO_3(ZnO)_m$ or $InGaO_3(Zn_{1-x}Mg_xO)_m$ before the formation of the gate-insulating layer on the channel layer: the current in the formed TFT is liable to change with time or gate shortage is liable to occur. Although the detailed mechanism therefor is not known, presumably the phenomena may be caused by unexpected diffusion of an impurity in the channel layer, impaired surface flatness, or formation of particles.

FIGS. 7A to 7F show a constitution of a TFT and a process for production thereof to avoid the above problems:

(7A) Channel layer 2701 is formed on substrate 2700.

(7B) The surface is covered with mask 2702, and drain electrode 2703 and source electrode 2704 are formed. Mask 2702 is slightly lifted from the surface of channel layer 2701 to prevent contact with the surface of channel layer 2701. Removal of mask 2702 leaves drain electrode 2703 and source electrode 2704.

(7C) First gate-insulating film 2705 and second gate-insulating film 2706 are formed. In steps 7A to 7C, operations of attaching and detaching of the mask are preferably conducted with interruption of the external air such as in vacuum.

(7D) Through hole 2707 is formed for connection with the drain electrode, and through hole 2708 is formed for connection with the source electrode through gate-insulating films 2705, 2706.

(7E) Conductive layer 2709 is formed.

(7F) Conductive film 2709 is patterned to form wiring 2710 for drawing-out from the drain electrode, wiring 2711 for drawing-out from the source electrode, and gate electrode 2712.

In the above steps, the surface of channel layer 2701 is not damaged by formation of conductive layer and other films and etching, so that a TFT is obtained with high performance and high reliability.

FIGS. 8A to 8F and FIGS. 9G to 9L show a more effective TFT constitution and production thereof for prevention of gate leakage and increasing driving performance of the gate electrode.

(8A) Channel layer 2801 is formed on substrate 2800.

(8B) First gate-insulating film 2802 is formed. In steps 8A and 8B, operations are preferably conducted with interruption of the external air; for example, in vacuum.

(8C) Photo resist 2803 is applied.

(8D) Photo resist 2803 is patterned.

(8E) First gate-insulating film 2802 is etched to form opening 2804 for drain electrode and opening 2805 for source electrode 2805.

(8F) First conductive layer 2806 is formed.

(9G) an unnecessary portion of conductive layer 2806 is lifted off in arrow-A direction.

(9H) Drain electrode 2807 and source electrode 2808 are formed.

(9I) Second gate-insulating film 2809 is formed.

(9J) Second gate-insulating film is patterned to form through hole 2810 for connection with the source electrode and through hole 2811 for connection with the drain electrode.

(9K) Second conductive layer 2812 is formed.

(9L) Second conductive film 2812 is patterned to form wiring 2813 for drawing-out from the drain electrode, wiring 2814 for drawing-out from the source electrode, and gate electrode 2815.

In the above process, first gate-insulating layer 2802 covers entirely channel layer 2801, but does not cover drain electrode 2808 and source electrode 2809. Therefore, the heights of the surfaces of first gate-insulating film 2802, drain electrode 2808, and source electrode 2809 are made uniform. Accordingly, the difference in the level of the second gate-insulating film 2809 is little, so that leakage is not caused at the gate, and second gate-insulating film 2809 can be made thin correspondingly to increase the capacity of the gate electrode and to increase the driving performance.

The constitutions and processes shown in FIGS. 7A to 7F, and FIGS. 8A to 8F and FIGS. 9G to 9L are expected to be effective for a gate-insulating film constituted of usual insulating material. However, the above constitutions and processes are especially effective for a channel layer employing an aforementioned transparent amorphous oxide containing at least In—Ga—Zn—O, represented by $InGaO_3(ZnO)_m$ (m: a natural number of less than 6) in a crystal state, containing carriers at a concentration of less than $1 \times 10^{18}/cm^3$, or a transparent amorphous oxide containing In—Ga—Zn—Mg—O, represented by $InGaO_3(Zn_{1-x}Mg_xO)_m$ (m: a natural number of less than 6; $0<x\leq1$) in a crystal state; and employing a gate-insulating film constituted of $HfO_2$ or $Y_2O_3$.

Thus, according to the present invention, a TFT can be obtained which exhibits a high mobility and a low threshold, causing less gate leakage, and having stable characteristics. In particular, a large-area TFT panel produced according to the present invention has balanced characteristics with high reliability.

THIRD EMBODIMENT

Passivation, Surface-Coating Layer

The field-effect transistor of this embodiment belongs to the category of the above seventh, eighth and ninth aspects of the invention.

The passsivation layer in the fifth aspect includes two conceptions. The passivation layer of a first conception is a separate layer provided between the active layer and the gate-insulating layer and constituted of a material different from that of the active layer or the gate-insulating layer. This passivation layer of the first concept is hereinafter referred to a "passivated layer". The passivated layer is composed, for example, of amorphous silicon oxide, amorphous silicon nitride, titanium oxide, aluminum oxide, magnesium oxide, or the like.

The passivation layer of a second conception is an outermost surface portion of the active layer treated with oxygen plasma. The treatment for formation of the passivation layer of the second conception is hereinafter referred to as "passivation treatment". In this conception, another layer composed of a material different from that of the active layer and the gate-insulating layer is not provided. Naturally, after the passivation treatment, a passivated layer of the first concept composed of amorphous silicon oxide may be further formed.

The passivated layer or the passivation treatment prevents deterioration of the ability of the gate-insulating film: the passivation layer serves as a current leakage-preventing layer.

The surface-coating layer in the field-effect transistor of the sixth aspect of the present invention is formed from amorphous silicon nitride, amorphous silicon oxide, amorphous silicon nitride, titanium oxide, aluminum oxide, magnesium oxide, or a like material. The surface-coating layer may be constituted of the same material as the aforementioned passivation layer or a different material.

The surface-coating layer improves the adhesiveness between the substrate and the active layer, serving as adhesion-improving layer to prevent film exfoliation, to decrease current leakage, and so forth. Further the surface-coating layer can mitigate projection and depression on the substrate to decrease current leakage and to improve the on-off ratio of the transistor.

In the aforementioned thin film transistor employing a transparent film, the gate-insulating film is preferably constituted of $Al_2O_3$, $Y_2O_3$, $HfO_2$, or a mixed crystal compound containing two or more thereof. Any defect on the interface between gate-insulating thin film and the thin channel layer decreases the electron mobility and causes hysteresis in transistor characteristics. The current leakage depends largely on the kind of the gate-insulating film. Therefore the gate-insulating film should be selected to be suitable to the channel layer.

The above problems are improved by introduction of an interface passivation layer, enabling use of an insulation layer of a high dielectric constant and to increase the electron mobility. Thus the interfacial passivation layer, which is one aspect of the present invention, enables formation of a TFT in which current leakage and hysteresis are decreased and electron mobility is increased. The TFT can be formed either in a stagger structure or in a reversed stagger structure since the gate-insulating layer and the channel layer can be formed at a room temperature.

The thin film transistor (TFT) is a three-terminal element having a gate terminal, a source terminal, and a drain terminal. The TFT is an active element which employs a semiconductor film formed on an insulating substrate made of a ceramic material, a glass material, or a plastic material as a channel layer for movement of electrons or holes; and controls the current flowing through the channel layer by applying a voltage to the gate to switch the current between the source terminal and the drain terminal.

The electron carrier concentration can be controlled by controlling the oxygen defect quantity as desired.

In the above first to third embodiments, the quantity of oxygen (oxygen defect quantity) in the transparent oxide film is controlled by forming the film in an atmosphere containing oxygen at a prescribed concentration. Otherwise, the oxygen defect quantity may be controlled (decreased or increased) after the film formation by post treatment of the oxide film in an atmosphere containing oxygen.

For effective control of the oxygen defect quantity, the temperature of the oxygen-containing atmosphere is controlled in a range from 0 to 300° C., preferably from 25 to 250° C., more preferably from 100 to 200° C.

Naturally, film may be formed in an oxygen-containing atmosphere and then post-treated in an oxygen-containing atmosphere. Otherwise the film may be formed without control of the oxygen partial pressure and post-treated in an oxygen-containing atmosphere, insofar as the intended electron carrier concentration (less than $1 \times 10^{18}/cm^3$) can be obtained.

The lower limit of the electron carrier concentration in the present invention is, for example, $1 \times 10^{14}/cm^3$, depending on the kind of the element, circuit, or device employing the produced oxide film.
(Amorphous Oxide)

The active layer employed in the above Embodiments 1 to 3 of the invention is explained below.

The electron carrier concentration in the amorphous oxide in the present invention is a value measured at a room temperature. The room temperature is a temperature in the range from 0° C. to about 40° C., for example, 25° C. The electron carrier concentration in the amorphous oxide in the present invention need not be less than $1 \times 10^{18}/cm^3$ throughout the entire range from 0 to 40° C. For example, the electron carrier concentration of less than $10^{18}/cm^3$ at a temperature of 25° C. is acceptable. At a lower electron carrier concentration, not more than $1\times10^{17}/cm^3$, or not more than $1\times10^{16}/cm^3$, a normally-off TFT can be produced at a high yield.

In the present specification, the description "less than $10^{18}/cm^3$" means "preferably less than $1\times10^{18}/cm^3$ and more preferably less than $1.0\times10^{18}/cm^3$".

The electron carrier concentration can be measured by measurement of a Hall Effect.

The amorphous oxide in the present invention is an oxide which exhibits a halo pattern and no characteristic diffraction line in an X-ray diffraction spectrometry.

In the amorphous oxide of the present invention, the lower limit of the electron carrier concentration is, for example, $1\times10^{12}/cm^3$, but is not limited insofar as it is applicable as a channel layer of a TFT.

Accordingly, in the present invention, the electron carrier concentration is adjusted by controlling the material, composition ratio, production conditions, and so forth of the amorphous oxide as in the Examples described later to be in the range, for instance, from $1\times10^{12}/cm^3$ to $1\times10^{18}/cm^3$, preferably from $1\times10^{13}/cm^3$ to $1\times10^{17}/cm^3$, more preferably from $1\times10^{15}/cm^3$ to $1\times10^{16}/cm^3$.

The amorphous oxide, other than the InZnGa oxides, can be selected suitably from In oxides, $In_xZn_{1-x}$ oxides ($0.2 \leq x \leq 1$), $In_xSn_{1-x}$ oxides ($0.8 \leq x \leq 1$), and $In_x(Zn,Sn)_{1-x}$ oxides ($0.15 \leq x \leq 1$). The $In_x(Zn,Sn)_{1-x}$ oxide can also be represented by $In_x(Zn_ySn_{1-y})_{1-x}$ ($0 \leq y \leq 1$).

When the In oxide contains neither Zn nor Sn, the In can be partly substituted by Ga: $In_xGa_{1-x}$ oxide ($0 \leq x \leq 1$).

An amorphous oxide of an electron carrier concentration of $1\times10^{18}/cm^3$ which is prepared by the inventors of the present invention is described below in detail.

One group of the aforementioned oxides are characteristically constituted of In—Ga—Zn—, represented by $InGaO_3(ZnO)_m$ (m: a natural number of less than 6) in a crystal state, and containing electron carriers at a concentration of less than $1\times10^{18}/cm^3$.

The other group of the aforementioned oxides are characteristically constituted of In—Ga—Zn—Mg—O, represented by $InGaO_3(Zn_{1-x}Mg_xO)_m$ (m: a natural number of less than 6, and $0<x\leq1$) in a crystal state, and containing electron carriers at a concentration of less than $1\times10^{18}/cm^3$.

The film constituted of such an oxide is preferably designed to exhibit preferably an electron mobility of higher than 1 $cm^2/V\cdot sec$.

By use of the above film as the channel layer, a TFT can be prepared which is normally-off with a gate current of less than 0.1 microampere in a transistor off-state, having an on-off ratio of higher than $1\times10^3$, being transparent to visible light and flexible.

In the above film, the electron mobility increases with the increase of the conduction electrons. The substrate for forming the transparent film includes glass plates, plastic plates, and plastic films.

In using the above amorphous oxide film as the channel layer, at least one of layers constituted of $Al_2O_3$, $Y_2O_3$ or $HfO_2$, or a mixed crystal compound thereof is useful as the gate-insulating film.

In a preferred embodiment, the film is formed in an oxygen gas-containing atmosphere without intentional addition of an impurity for increasing the electric resistance to the amorphous oxide.

The inventors of the present invention found that the amorphous thin films of semi-insulating oxides have characteristics that the electron mobility therein increases with increase in number of conduction electrons, and further found that a TFT prepared by use of the film is improved in transistor characteristics such as the on-off ratio, the saturation current in a pinch-off state, and the switching rate. Thus a normally-off type TFT can be produced by use of the amorphous oxide.

By use of the amorphous oxide thin film as the channel layer of a film transistor, the electron mobility can be made higher than 1 $cm^2/V\cdot sec$, preferably higher than 5 $cm^2/V\cdot sec$. The current between the drain terminal and the source terminal at an off-state (no gate voltage applied) can be controlled to be less than 10 microamperes, preferably less than more than 0.1 microamperes at the carrier concentration of lower than $1\times10^{18}/cm^3$, preferably lower than $1\times10^{16}/cm^3$. Further by use of this thin film, the saturation current after pinch-off can be raised to 10 microamperes or more and the on-off ratio can be raised to be higher than $1\times10^3$ for the electron mobility higher than 1 $cm^2/V\cdot sec$, preferably higher than 5 $cm^2/V\cdot sec$.

In a pinch-off state of the TFT, a high voltage is being applied to the gate terminal, and electrons are existing in a high density in the channel. Therefore, according to the present invention, the saturation current can be increased in correspondence with the increase of the electron mobility. Thereby, the transistor characteristics can be improved, such as increase of the on-off ratio, increase of the saturation current, and increase of the switching rate. In contrast, in a usual compound, the increase of electrons decreases the electron mobility owing to collision between electrons.

The structure of the aforementioned TFT may be a stagger (top gate) structure in which a gate-insulating film and a gate terminal are successively formed on a semiconductor channel layer, or a reversed stagger (bottom gate) structure in which a gate-insulating film and a semiconductor channel layer successively on a gate terminal.

(First Process for Film Formation: PLD Process)

The amorphous oxide thin film having the composition $InGaO_3(ZnO)_m$ (m: a natural number of less than 6) in a crystal state is stable up to a high temperature of 800° C. or higher when m is less than 6, whereas with increase of m, namely with increase of the ratio of ZnO to $InGaO_3$ near to the composition of ZnO, the oxide tends to crystallize. Therefore, the value m of the oxide is preferably less than 6 for use as the channel layer of the amorphous TFT.

The film formation is conducted preferably by a gas phase film formation process by use of a target of a polycrystalline sintered compact having a composition $InGaO_3(ZnO)_m$. Of the gas phase film formation processes, sputtering, and pulse laser vapor deposition are suitable. The sputtering is particularly suitable for the mass-production.

However, in formation of the amorphous film under usual conditions, oxygen defect can occur, so that the electron carrier concentration of less than $1\times10^{18}/cm^3$ and electric conductivity of less the 10 S/cm cannot be achieved. With such a film, a normally-off transistor cannot be constituted.

Figure 11:
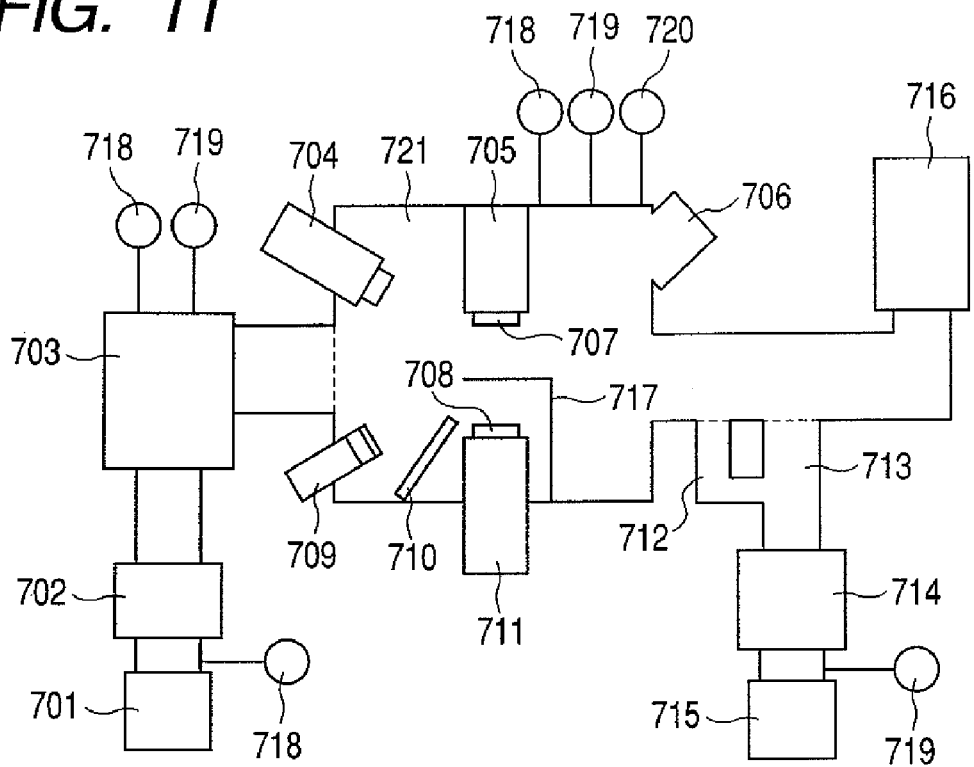
FIG. 11 illustrates schematically an apparatus for film formation by a PLD process.

The inventors of the present invention produced an In—Ga—Zn—O film by a pulse laser vapor deposition by use of the apparatus shown in FIG. 11.

The film-forming was carried out by using such a PLD film-forming apparatus as shown in FIG. 11.

In FIG. 11, the numerals indicate the followings: 701, an RP (rotary pump); 702, a TMP (turbo molecular pump); 703, a preliminary chamber; 704, an electron gun for RHEED; 705, a substrate-holding means for rotating and vertically moving the substrate; 706, a laser-introducing window; 707, a substrate; 708, a target; 709, a radical source; 710, a gas inlet; 711, a target-holding means for rotating and vertically moving the target; 712, a by-pass line; 713, a main line; 714, a TMP (turbo molecular pump); 715, an RP (rotary pump); 716, a titanium getter pump; 717, a shutter; 718, an IG (ion manometer); 719, a PG (Pirani gage); 720, a BG (baratron gage); and 721, a growth chamber.

An In—Ga—Zn—O type amorphous oxide semiconductor thin film was deposited on an $SiO_2$ glass substrate (Corning Co.: 1737) by a pulse laser vapor deposition employing a KrF excimer laser. As the pretreatment before the deposition, the substrate was washed ultrasonically for defatting with acetone, ethanol, and ultrapure water each for five minutes, and dried in the air at 100° C.

The polycrystalline target was an $InGaO_3(ZnO)_4$ sintered compact (size: 20 mm diameter, 5 mm thick), which had been prepared by wet-mixing $In_2O_3$, $Ga_2O_3$, and ZnO (each 4N reagent) as the source material (solvent: ethanol), calcining the mixture (1000° C., 2 hours), dry-crushing it, and sintering it (1550° C., 2 hours). The target had an electro conductivity of 90 S/cm.

The film formation was conducted by controlling the final vacuum of the growth chamber to be $2\times10^{-6}$ Pa, and the oxygen partial pressure during the growth to be 6.5 Pa. The oxygen partial pressure in growth chamber 721 was 6.5 Pa, and the substrate temperature was 25° C. The distance between target 708 and film-holding substrate 707 was 30 mm, the power introduced through introduction window 716 was in the range of 1.5-3 $mJ/cm^2$/pulse. The pulse width was 20 nsec, the repeating frequency was 10 Hz, and the irradiation spot size was 1×1 mm square. Under the above conditions, the film was formed at a rate of 7 nm/min.

The resulting thin film was examined by small angle X-ray scattered method (SAXS) (thin film method, incidence angle: 0.5°): no clear diffraction peak was observed. Thus the obtained In—Ga—Zn—O type thin film was judged to be amorphous. From X-ray reflectivity and its pattern analysis, the mean square roughness (Rrms) was found to be about 0.5 nm, and the film thickness to be about 120 nm. From fluorescence X-ray spectrometric analysis (XRF), the metal composition of the film was found to be In:Ga:Zn=0.98:1.02:4. The electric conductivity was less than about $1\times10^{-2}$ S/cm. The electron carrier concentration was estimated to be not more than $1\times10^{-16}/cm^3$. The electron mobility was estimated to be about 5 $cm^2/V\cdot sec$. From light absorption spectrum analysis, the optical bandgap energy breadth of the resulting amorphous thin film was estimated to be about 3 eV.

The above results show that the obtained In—Ga—Zn—O type thin film is a transparent flat thin film having an amorphous phase of a composition near to a crystalline $InGaO_3(ZnO)_4$, having less oxygen defect, and having lower electric conductivity.

The above film formation is explained specifically by reference to FIG. 1. FIG. 1 shows dependency of the electron carrier concentration in the formed transparent amorphous oxide thin film on the oxygen partial pressure for the film of a composition of $InGaO_3(ZnO)_m$ (m: an integer less than 6) in an assumed crystalline state under the same film formation conditions as in the above Example.

By formation of the film in an atmosphere having an oxygen partial pressure of higher than 4.5 Pa under the same conditions as in the above Example, the electron carrier concentration could be lowered to less than $1\times10^{18}/cm^3$ as shown in FIG. 1. In this film formation, the substrate was kept nearly at room temperature without intentional heating. For use of a flexible plastic film as the substrate, the substrate temperature is kept preferably at a temperature lower than 100° C.

The higher oxygen partial pressure enables decrease of the electron carrier concentration. For instance, as shown in FIG. 1, the thin $InGaO_3(ZnO)_4$ film formed at the substrate temperature of 25° C. and the oxygen partial pressure of 5 Pa had a lower electron carrier concentration of $1\times10^{16}/cm^3$.

Figure 2:
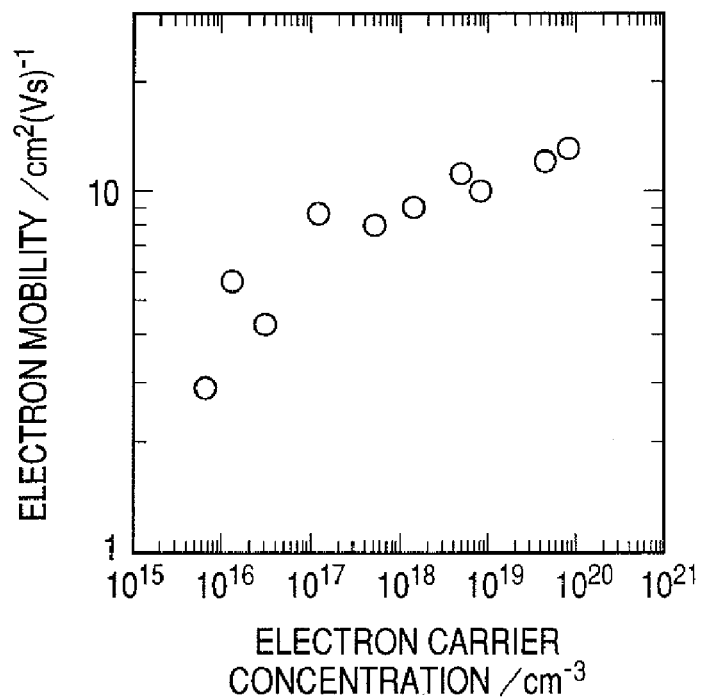
FIG. 2 is a graph dependency of the electron mobility on the carrier concentration of the In—Ga—Zn—O type amorphous oxide formed by a pulse laser vapor deposition process.

In the obtained thin film, the electron mobility was higher than 1 $cm^2/V\cdot sec$ as shown in FIG. 2. However, the film deposited by the pulse laser vapor deposition at an oxygen partial pressure of higher than 6.5 Pa as in this Example has a rough surface, being not suitable for a channel layer of the TFT.

Accordingly, a normally-off type transistor can be constructed by using a transparent thin amorphous oxide represented by $InGaO_3(ZnO)_m$ (m: a number less than 6) in a crystal state formed at an oxygen partial pressure of higher than 4.5 Pa, preferably higher than 5 Pa, but lower than 6.5 Pa by a pulse laser vapor deposition method in the above Example.

The above obtained thin film exhibited an electron mobility higher than 1 $cm^2/V$, and the on-off ratio could be made higher than $1\times10^3$.

As described above, in formation of an InGaZn oxide film by a PLD method under the conditions shown in this Example, the oxygen partial pressure is controlled in the range preferably from 4.5 Pa to 6.5 Pa.

For achieving the electron carrier concentration of $1\times10^{18}/cm^3$, the oxygen partial pressure conditions, the constitution of the film formation apparatus, the kind and composition of the film-forming material should be controlled.

Next, a top-gate type MISFET element as shown in FIG. 5 was produced by forming an amorphous oxide with the aforementioned apparatus at an oxygen partial pressure of 6.5 Pa. Specifically, on glass substrate 1, a semi-insulating amorphous $InGaO_3(ZnO)_4$ film of 120 nm thick was formed for use for channel layer 2 by the above method of formation of amorphous thin Ga—Ga—Zn—O film. Further thereon an $InGaO_3(ZnO)_4$ film having a higher electro conductivity and a gold film were laminated respectively in a thickness of 30 nm by pulse laser deposition at an oxygen partial pressure of lower than 1 Pa in the chamber. Then drain terminal 5 and source terminal 6 were formed by photolithography and a lift-off method. Finally, a $Y_2O_3$ film for gate-insulating film 3 was formed by an electron beam vapor deposition method (thickness: 90 nm, relative dielectric constant: about 15, leak current density: $1\times10^{-3}$ $A/cm^3$ at application of 0.5 MV/cm). Thereon, a gold film was formed, and gate terminal 4 was formed by photolithography and lifting-off.

Evaluation of Characteristics of MISFET Element

Figure 6:
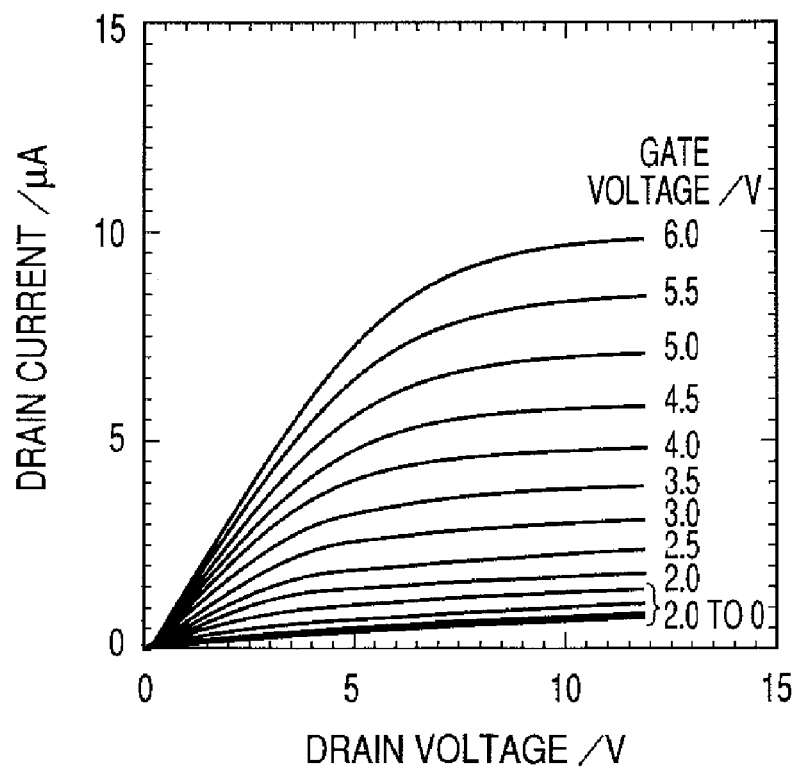
FIG. 6 is a graph showing the electric current-voltage characteristics of a top gate type TFT element employing $Y_2O_3$ as the gate-insulating film, prepared in Example 6.
Figure 7A:
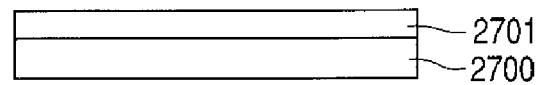
FIGS. 7A, 7B, 7C, 7D, 7E, and 7F illustrate a first example of the process of production of TFT of the present invention.
Figure 7B:
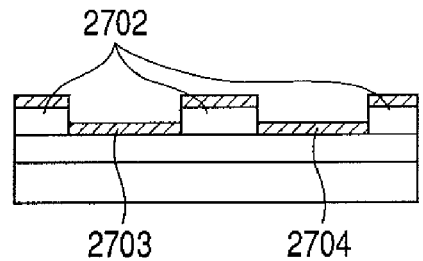
Figure 7C:
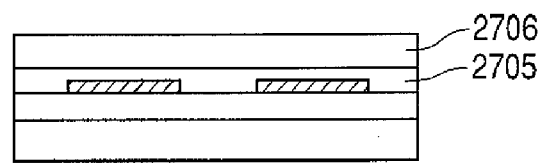
Figure 7D:
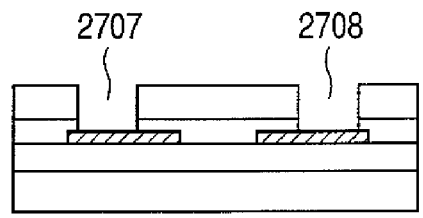
Figure 7E:
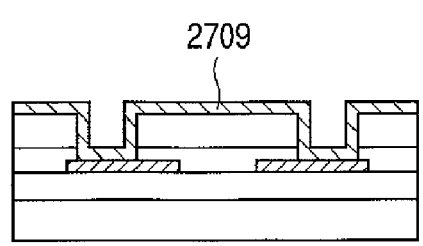
Figure 7F:
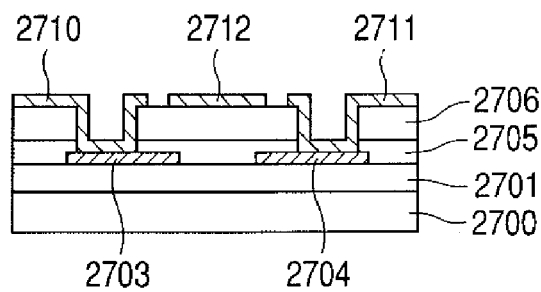
Figure 8A:
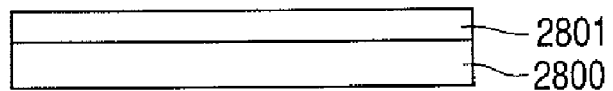
FIGS. 8A, 8B, 8C, 8D, 8E, and 8F illustrate a second example of the process of production of TFT of the present invention.
Figure 8B:
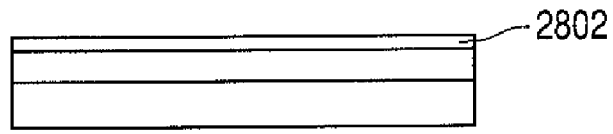
Figure 8C:
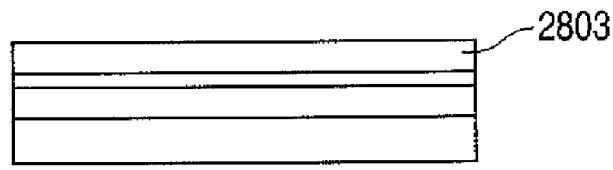
Figure 8D:
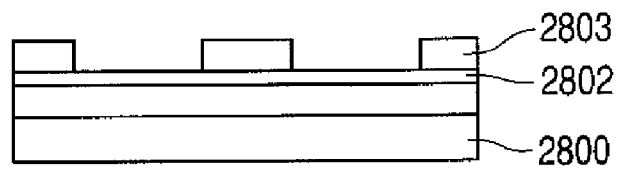
Figure 8E:
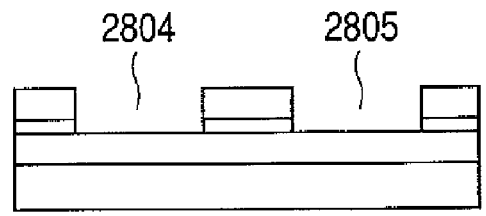
Figure 8F:
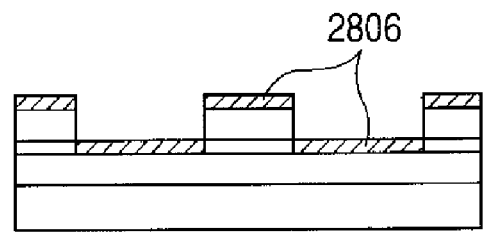
Figure 9G:
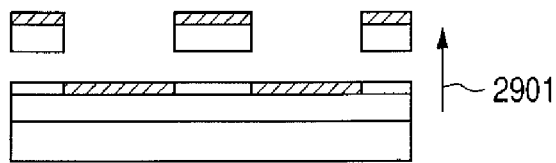
FIGS. 9G, 9H, 9I, 9J, 9K, and 9L illustrate the second example of the process of production of TFT of the present invention.
Figure 9H:
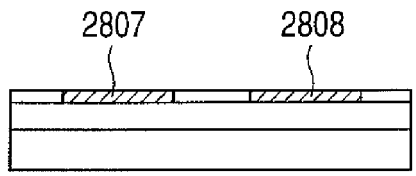
Figure 9I:
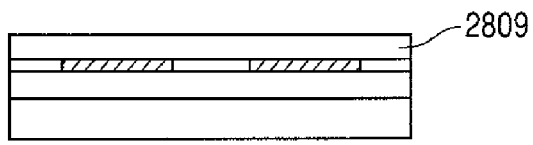
Figure 9J:
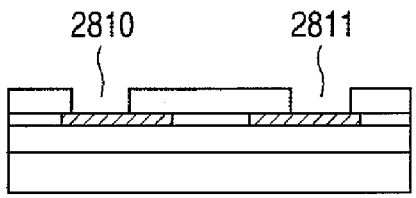
Figure 9K:
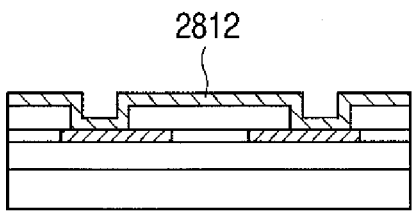
Figure 9L:
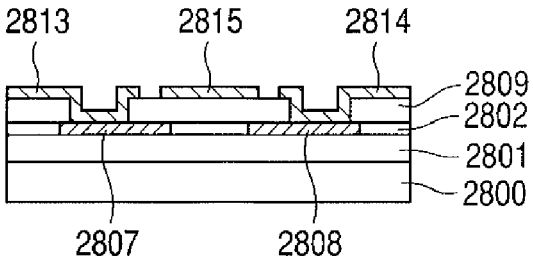

FIG. 6 shows current-voltage characteristics of the MISFET element measured at room temperature. The channel is understood to be an n-type semiconductor from the increase of the drain current $I_{DS}$ with the increase of the drain voltage $V_{DS}$. This is consistent with the fact that an amorphous In—Ga—Zn—O type semiconductor is of an n-type. The $I_{DS}$ becomes saturated (pinched off) at $V_{DS}=6V$, which is typical behavior of a semiconductor transistor. From examination of the gain characteristics, the threshold value of the gate voltage $V_{GS}$ under application of $V_{DS}=4V$ was found to be about $-0.5$ V. A current flow of $I_{DS}=1.0\times10^{-5}$ A was caused at $V_G=10V$. This corresponds to carrier induction by gate bias in the In—Ga—Zn—O type amorphous semiconductor thin film.

The on-off ratio of the transistor was higher than $1\times10^3$. From the output characteristics, the field effect mobility was calculated to be about 7 $cm^2 (Vs)^{-1}$. Irradiation of visible light did not change the transistor characteristics of the produced element according to the same measurement.

According to the present invention, a thin film transistor can be produced which has a channel layer containing electron carriers at a lower concentration to achieve higher electric resistance and exhibiting a higher electron mobility.

The above amorphous oxide has excellent characteristics that the electron mobility increases with the increase of the electron carrier concentration, and exhibits degenerate conduction. In this Example, the thin film was formed on a glass substrate. However, a plastic plate or film is useful as the substrate since the film formation can be conducted at room temperature. Further, the amorphous oxide obtained in this Example, absorbs visible light only little to give transparent flexible TFT.

(Second Process for Film Formation: Sputtering Process (SP Process))

Film formation by a high-frequency SP process by use of an argon gas as the atmosphere gas is explained below.

Figure 12:
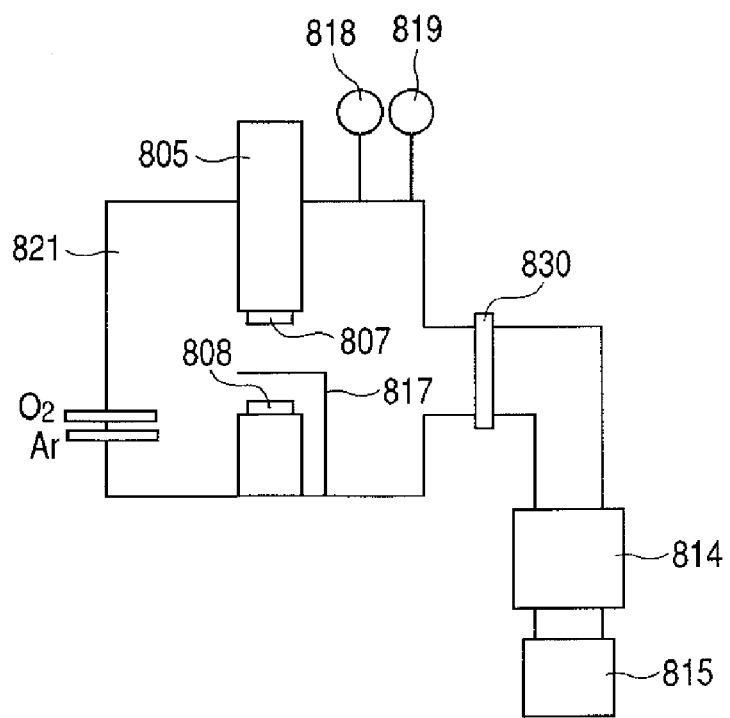
FIG. 12 illustrates schematically an apparatus for film formation by a sputtering process.

The SP process was conducted by use of the apparatus shown in FIG. 12. In FIG. 12, the numerals indicates the followings: 807, a substrate for film formation; 808, a target; 805, a substrate-holding means equipped with a cooling mechanism; 814, a turbo molecular pump; 815, a rotary pump; 817, a shutter; 818, an ion manometer; 819, a Pirani gage; 821, a growth chamber; and 830, a gate valve.

Substrate 807 for film formation was an $SiO_2$ glass substrate (Corning Co.: 1737) which had been washed ultrasonically for defatting with acetone, ethanol, and ultrapure water respectively for 5 minutes, and dried at 100° C. in the air.

The target was a polycrystalline sintered compact having a composition of $InGaO_3(ZnO)_4$ (size: 20 nm diameter, 5 mm thick), which had been prepared by wet-mixing $In_2O_3$, $Ga_2O_3$, and ZnO (each 4N reagent) as the source material (solvent: ethanol), calcining the mixture (1000° C., 2 hours), dry-crushing it, and sintering (1550° C., 2 hours). Target 808 had an electro conductivity of 90 S/cm, being semi-insulating.

The final vacuum degree of growth chamber 821 was $1 \times 10^{-4}$ Torr. During the growth, the total pressure of the oxygen and argon gas was kept constant within the range of 4 to $0.1 \times 10^{-1}$ Pa. The partial pressure ratio of argon to oxygen was changed in the range of the oxygen partial pressure from $1 \times 10^{-3}$ to $2 \times 10^{-1}$ Pa.

The substrate temperature was room temperature. The distance between target 808 and substrate 807 for film formation was 30 mm.

The inputted electric power was RF 180 W, and the film forming rate was 10 nm/min.

The resulting thin film was examined by small angle X-ray scattering method (SAXS) (thin film method, incidence angle: 0.5°): no clear diffraction peak was observed. Thus the obtained In—Ga—Zn—O type thin film was judged to be amorphous. From X-ray reflectivity and its pattern analysis, the mean square roughness (Rrms) was found to be about 0.5 nm, and the film thickness to be about 120 nm. From fluorescence X-ray spectrometric analysis (XRF), the metal composition of the film was found to be In:Ga:Zn=0.98:1.02:4.

Figure 3:
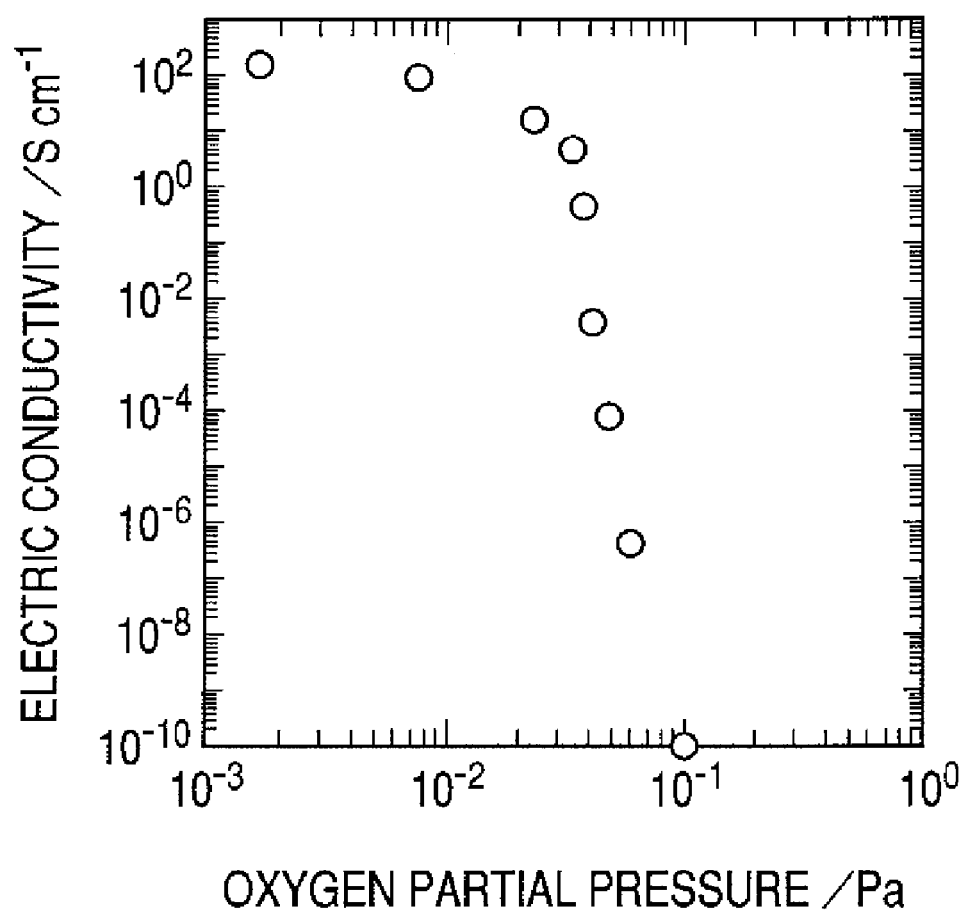
FIG. 3 is a graph showing dependency of the electric conductivity of the In—Ga—Zn—O type amorphous oxide formed by a high-frequency sputtering process employing an argon gas on the oxygen partial pressure during the film formation.

The films were formed at various oxygen partial pressure of the atmosphere, and the resulting amorphous oxide films were measured for electric conductivity. FIG. 3 shows the result.

As shown in FIG. 3, the electric conductivity can be lowered to less than 10 S/cm by conducting the film formation in an atmosphere having an oxygen partial pressure higher then $3 \times 10^{-2}$ Pa. The electron carrier number could be decreased by increase of the oxygen partial pressure.

As shown in FIG. 3, for instance, the thin $InGaO_3(ZnO)_4$ film formed at the substrate temperature of 25° C. and the oxygen partial pressure or $1 \times 10^{-1}$ Pa had a lower electric conductivity of about $1 \times 10^{-10}$ S/cm. Further, the thin $InGaO_3(ZnO)_4$ film formed at the oxygen partial pressure or $1 \times 10^{-1}$ Pa had an excessively high electric resistance, having the electric conductivity not measurable. With this film, although the electron mobility was not measurable, the electron mobility was estimated to be about 1 $cm^2/V \cdot sec$ by extrapolation from the values of the films of high electron carrier concentration.

Thus, a normally-off transistor having the on-off ratio of higher than $1 \times 10^3$ could be obtained by use of a transparent thin amorphous oxide film constituted of In—Ga—Zn—O represented in a crystal state by $InGaO_3(ZnO)_m$ (m: a natural number of less than 6) produced by sputtering vapor deposition in an argon atmosphere containing oxygen at a partial pressure of higher than $3 \times 10^{-2}$ Pa, preferably higher than $5 \times 10^{-1}$ Pa.

In use of the apparatus and the material employed in this Example, the film formation by sputtering is conducted in the oxygen partial pressure ranging from $3 \times 10^{-2}$ Pa to $5 \times 10^{-1}$ Pa. Incidentally, in the thin film produced by pulse laser vapor deposition or sputtering, the electron mobility increases with increase in number of the conductive electrons, as shown in FIG. 2.

As described above, by controlling the oxygen partial pressure, the oxygen defect can be decreased, and thereby the electron carrier concentration can be decreased. In the amorphous thin film, the electron mobility can be high, since no grain interface exists essentially in the amorphous state differently from polycrystalline state.

Incidentally, the substitution of the glass substrate by a 200 μm-thick polyethylene terephthalate (PET) film did not change the properties of the amorphous oxide film of $InGaO_3(ZnO)_4$ formed thereon.

A high-resistance amorphous film $InGaO_3(Zn_{1-x}Mg_xO)_m$ (m: an natural number less than 6; $0 < x \leq 1$) can be obtained by using, as the target, polycrystalline $InGaO_3(Zn_{1-x}Mg_xO)$, even at an oxygen partial pressure less than 1 Pa. For instance, with a target in which 80 atom % of Zn is replaced by Mg, the electron carrier concentration lower than $1 \times 10^{16}$/cm (resistance: about $1 \times 10^{-2}$ S/cm) can be achieved by pulse laser deposition in an atmosphere containing oxygen at a partial pressure of 0.8 Pa. In such a film, the electron mobility is lower than that of the Mg-free film, but the decrease is slight: the electron mobility is about 5 $cm^2/V \cdot sec$ at room temperature, being higher by about one digit than that of amorphous silicon. When the films are formed under the same conditions, increase of the Mg content decreases both the electric conductivity and the electron mobility. Therefore, the content of the Mg ranges preferably from 20% to 85% ($0.2 < x < 0.85$).

As described above, the oxygen defect are decreased by control of the oxygen partial pressure, and the electron carrier concentration can be decreased without addition of specific impurity ions. In the amorphous thin film, the electron mobility can be high, since no grain interface exists essentially in the amorphous state, being different from polycrystalline state. Further, since the electric conductivity can be decreased without addition of specific impurity ions, the electron mobility can be kept high without scattering by the impurity.

In the thin film transistor employing the above amorphous oxide film, the gate-insulating film contains preferably a mixed crystal compound containing two or more of $Al_2O_3$, $Y_2O_3$, $HfO_2$, and compounds thereof.

The presence of a defect at the interface between the gate-insulating thin film and the channel layer thin film lowers the electron mobility and causes hysteresis of the transistor characteristics. Moreover, the current leakage depends greatly on the kind of the gate-insulating film. Therefore the gate-insulating film should be selected to be suitable for the channel layer. The current leakage can be decreased by use of an $Al_2O_3$ film, the hysteresis can be made smaller by use of a Y$_2$O$_3$ film, and the electron mobility can be increased by use of an HfO$_2$ film having a high dielectric constant. By use of the mixed crystal of the above compounds, TFT can be formed which causes smaller current leakage, less hysteresis, and exhibiting a higher electron mobility. Since the gate-insulating film forming process and the channel layer forming process can be conducted at room temperature, the TFT can be formed in a stagger constitution or in a reversed stagger constitution.

The TFT thus formed is a three-terminal element having a gate terminal, a source terminal, and a drain terminal. This TFT is formed by forming a semiconductor thin film on a insulating substrate of a ceramics, glass, or plastics as a channel layer for transport of electrons or holes, and serves as an active element having a function of controlling the current flowing through the channel layer by application of a voltage to the gate terminal, and switching the current between the source terminal and the drain terminal.

In the present invention, it is important that an intended electron carrier concentration is achieved by controlling the amount of the oxygen defect.

In the above description, the amount of the oxygen in the amorphous oxide film is controlled by controlling the oxygen concentration in the film-forming atmosphere. Otherwise the oxygen defect quantity can be controlled (decreased or increase) by post-treatment of the oxide film in an oxygen-containing atmosphere as a preferred embodiment.

For effective control of the oxygen defect quantity, the temperature of the oxygen-containing atmosphere is controlled in the range from 0° C. to 300° C., preferably from 25° C. to 250° C., more preferably from 100° C. to 200° C.

Naturally, a film may be formed in an oxygen-containing atmosphere and further post-treated in an oxygen-containing atmosphere. Otherwise the film is formed without control of the oxygen partial pressure and post-treatment is conducted in an oxygen-containing atmosphere, insofar as the intended electron carrier concentration (less than $1\times10^{18}$/cm$^3$) can be achieved.

The lower limit of the electron carrier concentration in the present invention is, for example, $1\times10^{14}$/cm$^3$, depending on the kind of the element, circuit, or device employing the produced oxide film.

(Broader Range of Materials)

After investigation on other materials for the system, it was found that an amorphous oxide composed of at least one oxide of the elements of Zn, In, and Sn is useful for an amorphous oxide film of a low carrier concentration and high electron mobility. This amorphous oxide film was found to have a specific property that increase in number of conductive electrons therein increases the electron mobility. Using this film, a normally-off type TFT can be produced which is excellent in transistor properties such as the on-off ratio, the saturation current in the pinch-off state, and the switching rate.

A complex oxide can be formed by incorporating additionally one of the elements shown below into the above amorphous oxide containing at least one of the elements of Zn, In, and Sn, the additional elements including:

Group-2 elements M2 having an atomic number lower than Zn (Mg, and Ca),
Group-3 elements M3 having an atomic number lower than In (B, Al, Ga, and Y),
Group-4 elements M4 having an atomic number lower than Sn (Si, Ge, and Zr),
Group-5 elements M5 (V, Nb, and Ta), and Lu, and W.

In the present invention, an oxide having any one of the characteristics of (a) to (h) below are useful:

(a) An amorphous oxide which has an electron carrier concentration less than $1\times10^{18}$/cm$^3$;

(b) An amorphous oxide in which the electron mobility becomes increased with increase of the electron carrier concentration;

(The room temperature signifies a temperature in the range from about 0° C. to about 40° C. The term "amorphous compound" signifies a compound which shows a halo pattern only without showing a characteristic diffraction pattern in X-ray diffraction spectrum. The electron mobility signifies the one measured by the Hall effect.)

(c) An amorphous oxide mentioned in the above items (a) or (b), in which the electron mobility at room temperature is higher than 0.1 cm$^2$/V·sec;

(d) An amorphous oxide mentioned, in any of the items (b) to (c), which shows degenerate conduction;

(The term "degenerate conduction" signifies the state in which the thermal activation energy in temperature dependency of the electric resistance is not higher than 30 meV.)

(e) An amorphous oxide, mentioned in any of the above item (a) to (d), which contains at least one of the elements of Zn, In, and Sn as the constituting element;

(f) An amorphous oxide film composed of the amorphous oxide mentioned the above item (e), and additionally at least one of the elements of
Group-2 elements M2 having an atomic number lower than Zn (Mg, and Ca),
Group-3 elements M3 having an atomic number lower than In (B, Al, Ga, and Y),
Group-4 elements M4 having an atomic number lower than Sn (Si, Ge, and Zr),
Group-5 elements M5 (V, Nb, and Ta), and
Lu, and W to lower the electron carrier concentration;
(The elements of M2, M3, M4 having respectively a lower atomic number than Zn, In, and Sn are highly ionic, thereby less oxygen defect being caused, and the electron carrier concentration being decreased. The element Lu, which has a higher atomic number than Ga, has a small ionic radius, and highly ionic to serve the same function as M3. M5, which is ionizable to be plus five-valent, being capable of bonding to oxygen strongly, and being less liable to cause oxygen defect. W, which is ionizable to be plus six-valent, being capable of bonding to oxygen strongly, and being less liable to cause oxygen defect.)

(g) An amorphous oxide film, mentioned in any of the above items (a) to (f), constituted of a single compound having a composition of In$_{2-x}$M3$_x$O$_3$(Zn$_{1-y}$M2$_y$O)$_m$ $0 \leq x \leq 2$; $0 \leq 1$; m: 0 or a natural number of less than 6) in a crystal state, or a mixture of the compounds different in number m, an example of M3 being Ga, and an example of M2 being Mg; and (h) An amorphous oxide film, mentioned in any of the above items (a) to (g) formed on a plastic substrate or an plastic film.

The present invention also provides a field-effect transistor employing the above mentioned amorphous oxide or amorphous oxide film as the channel layer.

A field-effect transistor is prepared which is employs an amorphous oxide film having an electron carrier concentration of less than $1\times10^{18}$/cm$^3$ but more than $1\times10^{15}$/cm$^3$ as the channel layer, and having a source terminal and a drain terminal, and a gate terminal with interposition of a gate-insulating film. When a voltage of about 5 V is applied between the source and drain terminals without application of gate voltage, the electric current between the source and drain terminals is about $1\times10^{-7}$ amperes.

The electron mobility in the oxide crystal becomes larger with increase of the overlap of the s-orbitals of the metal ions. In an oxide crystal of Zn, In, or Sn having a higher atomic number, the electron mobility is in the range from 0.1 to 200 $cm^2/V \cdot sec$.

In an oxide, oxygen and metal ions are bonded by ionic bonds without orientation of the chemical bonds, having a random structure. Therefore in the oxide in an amorphous state, the electron mobility can be comparable to that in a crystal state.

On the other hand, substitution of the Zn, In, or Sn with an element of a lower atomic number decreases the electron mobility. Thereby the electron mobility in the amorphous oxide of the present invention ranges from about 0.01 to 20 $cm^2/V \cdot sec$.

In the transistor having a channel layer constituted of the above oxide, the gate-insulating film is preferably formed from $Al_2O_3$, $Y_2O_3$, $HfO_2$, or a mixed crystal compound containing two or more thereof.

The presence of a defect at the interface between the gate-insulating thin film and the thin channel layer film lowers the electron mobility and causes hysteresis of the transistor characteristics. Moreover, the current leakage depends greatly on the kind of the gate-insulating film. Therefore the gate-insulating film should be selected to be suitable for the channel layer. The current leakage can be decreased by use of an $Al_2O_3$ film, the hysteresis can be made smaller by use of a $Y_2O_3$ film, and the electron mobility can be increased by use of an $HfO_2$ film having a high dielectric constant. By use of the mixed crystal of the above compounds, TFT can be formed which causes smaller current leakage, less hysteresis, and exhibiting a higher electron mobility. Since the gate-insulating film-forming process and the channel layer-forming process can be conducted at room temperature, the TFT can be formed in a stagger constitution or in a reversed stagger constitution.

The $In_2O_3$ oxide film can be formed through a gas-phase process, and addition of moisture in a partial pressure of about 0.1 Pa to the film-forming atmosphere makes the formed film amorphous.

ZnO and $SnO_2$ respectively cannot readily be formed in an amorphous film state. For formation of the ZnO film in an amorphous state, $In_2O_3$ is added in an amount of 20 atom %. For formation of the $SnO_2$ film in an amorphous state, $In_2O_3$ is added in an amount of 90 atom %. In formation of Sn—In—O type amorphous film, gaseous nitrogen is introduced in a partial pressure of about 0.1 Pa in the film formation atmosphere.

To the above amorphous film, may be added an element capable of forming a complex oxide, selected from Group-2 elements M2 having an atomic number lower than Zn (Mg, and Ca), Group-3 elements M3 having an atomic number lower than In (B, Al, Ga, and Y), Group-4 elements M4 having an atomic number lower than Sn (Si, Ge, and Zr), Group-5 elements M5 (V, Nb, and Ta), and Lu, and W. The addition of the above element stabilizes the amorphous film at room temperature, and broadens the composition range for amorphous film formation.

In particular, addition of B, Si, or Ge tending to form a covalent bond is effective for amorphous phase stabilization. Addition of a complex oxide constituted of ions having largely different ion radiuses is effective for amorphous phase stabilization. For instance, in an In—Zn—O system, for formation of a film stable at room temperature, In should be contained more than about 20 atom %. However, addition of Mg in an amount equivalent to In enables formation of stable amorphous film in the composition range of In of not less than about 15 atom %.

In a gas-phase film formation, an amorphous oxide film of the electron carrier concentration ranging from $1 \times 10^{15}/cm^3$ to $1 \times 10^{18}/cm^3$ can be obtained by controlling the film forming atmosphere.

An amorphous oxide film can be suitably formed by a vapor phase process such as a pulse laser vapor deposition process (PLD process), a sputtering process (SP process), and an electron-beam vapor deposition. Of the vapor phase processes, the PLD process is suitable in view of ease of material composition control, whereas the SP process is suitable in view of the mass production. However, the film-forming process is not limited thereto.

(Formation of In—Zn—Ga—O Type Amorphous Oxide Film by PLD Process)

An In—Zn—Ga—O type amorphous oxide was deposited on a glass substrate (Corning Co.: 1737) by a PLD process employing a KrF excimer laser with a polycrystal sintered compact as the target having a composition of $InGaO_3(ZnO)$ or $InGaO_3(ZnO)_4$.

The apparatus shown in FIG. 11 was employed which is mentioned before, and the film formation conditions were the same as mentioned before for the apparatus.

The substrate temperature was 25° C.

The resulting two thin films were examined by small angle X-ray scattering method (SAXS) (thin film method, incidence angle: 0.5°): no clear diffraction peak was observed, which shows that the obtained In—Ga—Zn—O type thin films produced with two different targets were both amorphous.

From X-ray reflectivity of the In—Zn—Ga—O type amorphous oxide film of the glass substrate and its pattern analysis, the mean square roughnesses (Rrms) of the thin films were found to be about 0.5 nm, and the film thicknesses to be about 120 nm. From fluorescence X-ray spectrometric analysis (XRF), the film obtained with the target of the polycrystalline sintered compact of $InGaO_3(ZnO)$ was found to contain the metals at a composition ratio In:Ga:Zn=1.1:1.1:0.9, whereas the film obtained with the target of the polycrystalline sintered compact of $InGaO_3(ZnO)_4$ was found to contain the metals at a composition ratio In:Ga:Zn=0.98:1.02:4.

Amorphous oxide films were formed at various oxygen partial pressure of the film-forming atmosphere with the target having the composition of $InGaO_3(ZnO)_4$. The formed amorphous oxide films were measured for the electron carrier concentration. FIG. 1 shows the results. By formation of the film in an atmosphere having an oxygen partial pressure of higher than 4.2 Pa, the electron carrier concentration could be lowered to less than $1 \times 10^{18}/cm^3$ as shown in FIG. 1. In this film formation, the substrate was kept nearly at room temperature without intentional heating. At the oxygen partial pressure of lower than 6.5 Pa, the surfaces of the obtained amorphous oxide films were flat.

At the oxygen partial pressure of 5 Pa, in the amorphous film formed with the $InGaO_3(ZnO)_4$ target, the electron carrier concentration was $1 \times 10^{16}/cm^3$, the electroconductivity was $1 \times 10^{-2}$ S/cm, and the electron mobility therein was estimated to be about 5 $cm^2/V \cdot sec$. From the analysis of the light absorption spectrum, the optical bandgap energy breadth of the formed amorphous oxide film was estimated to be about 3 eV.

The higher oxygen partial pressure further lowered the electron carrier concentration. As shown in FIG. 1, in the In—Zn—Ga—O type amorphous oxide film formed at a substrate temperature of 25° C. at an oxygen partial pressure of 6 Pa, the electron carrier concentration was lowered to $8\times10^{15}/cm^3$ (electroconductivity: about $8\times10^{-3}$ S/cm). The electron mobility in the film was estimated to be 1 $cm^2/V\cdot sec$ or more. However, by the PLD process, at the oxygen partial pressure of 6.5 Pa or higher, the deposited film has a rough surface, being not suitable for use as the channel layer of the TFT.

The In—Zn—Ga—O type amorphous oxide films were formed at various oxygen partial pressures in the film-forming atmosphere with the target constituted of a polycrystalline sintered compact having the composition of $InGaO_3(ZnO)_4$. The resulting films were examined for the relation between the electron carrier concentration and the electron mobility. FIG. 2 shows the results. Corresponding to the increase of the electron carrier concentration from $1\times10^{16}/cm^3$ to $1\times10^{20}/cm^3$, the electron mobility increased from about 3 $cm^2/V\cdot sec$ to about 11 $cm^2/V\cdot sec$. The same tendency was observed with the amorphous oxide films obtained with the polycrystalline sintered $InGaO_3(ZnO)$ target.

The In—Zn—Ga—O type amorphous oxide film which was formed on a 200 μm-thick polyethylene terephthalate (PET) film in place of the glass substrate had similar characteristics.

(Formation of In—Zn—Ga—Mg—O Type Amorphous Oxide Film by PLD Process)

A film of $InGaO_3(Zn_{1-x}Mg_xO)_4$ ($0<x\leq1$) was formed on a glass substrate by a PLD process with an $InGaO_3(Zn_{1-x}Mg_xO)_4$ target ($0<x\leq1$). The apparatus employed was the one shown in FIG. 11.

An $SiO_2$ glass substrate (Corning Co.: 1737) was used as the substrate. As the pretreatment, the substrate was washed ultrasonically for defatting with acetone, ethanol, and ultrapure water each for five minutes, and dried in the air at 100. The target was a sintered compact of $InGaO_3 (Zn_{1-x}Mg_xO)_4$ (x=1-0) (size: 20 mm diameter, 5 mm thick).

The target was prepared by wet-mixing source materials $In_2O_3$, $Ga_2O_3$, and ZnO (each 4N reagent) (solvent: ethanol), calcining the mixture (1000° C., 2 hours), dry-crushing it, and sintering it (1550° C., 2 hours). The final pressure in the growth chamber was $2\times10^{-6}$ Pa. The oxygen partial pressure during the growth was controlled at 0.8 Pa. The substrate temperature was room temperature (25° C.). The distance between the target and the substrate for film formation was 30 mm. The KrF excimer laser was irradiated at a power of 1.5 $mJ/cm^2$/pulse with the pulse width of 20 nsec, the repeating frequency of 10 Hz, and the irradiation spot size of 1×1 mm square. The film-forming rate was 7 nm/min. The oxygen partial pressure in the film-forming atmosphere was 0.8 Pa. The substrate temperature was 25° C.

The resulting thin film was examined by small angle X-ray scattering method (SAXS) (thin film method, incidence angle: 0.5°): no clear diffraction peak was observed. Thus the obtained In—Ga—Zn—Mg—O type thin film was amorphous. The resulting film had a flat surface.

By using targets of different x-values (different Mg content), In—Zn—Ga—Mg—O type amorphous oxide films were formed at the oxygen partial pressure of 0.8 Pa in a film-forming atmosphere to investigate the dependency of the conductivity, the electron carrier concentration, and the electron mobility on the x-value.

Figure 4A:
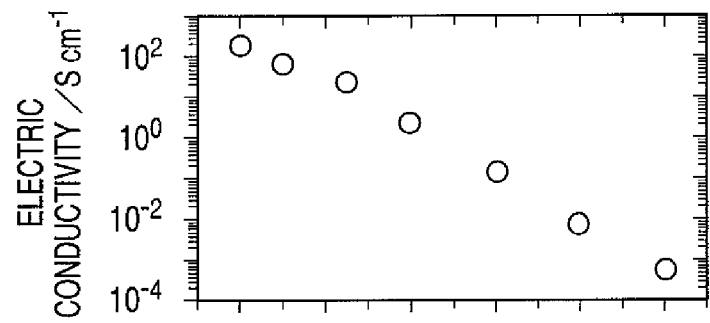
FIGS. 4A, 4B, and 4C are graphs showing change of electric conductivity, carrier concentration, and electron mobility depending to the value X of $InGaO_3(Zn_{1-x}Mg_xO)_4$ film formed by pulse laser vapor deposition in an atmosphere containing oxygen at a partial pressure of 0.8 Pa.
Figure 4B:
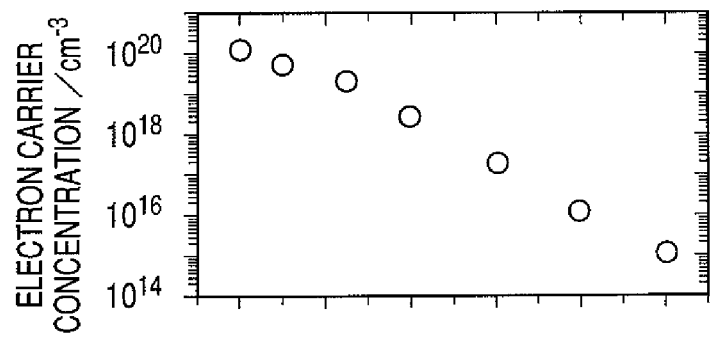
Figure 4C:
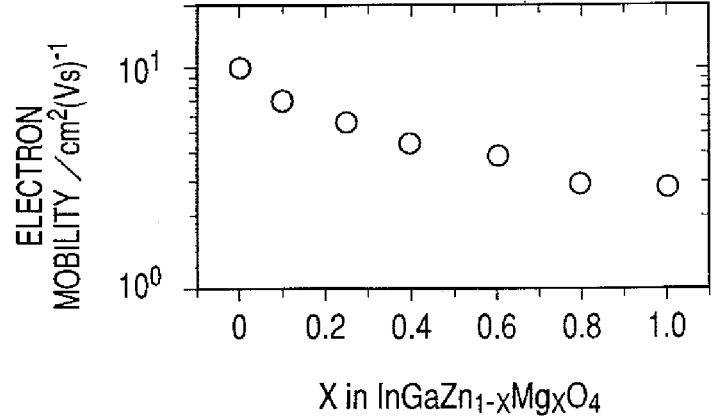

FIGS. 4A, 4B, and 4C show the results. At the x values higher than 0.4, in the amorphous oxide films formed by the PLD process at the oxygen partial pressure of 0.8 Pa in the atmosphere, the electron carrier concentration was decreased to be less than $1\times10^{18}/cm^3$. In the amorphous film of x value higher than 0.4, the electron mobility was higher than 1 $cm^2/V$.

As shown in FIGS. 4A, 4B, and 4C, the electron carrier concentration less than $1\times10^{16}/cm^3$ could be achieved in the film prepared by a pulse laser deposition process with the target in which 80 atom % of Zn is replaced by Mg and at the oxygen partial pressure of 0.8 Pa (electric resistance: about $1\times10^{-2}$ S·cm). In such a film, the electron mobility is decreased in comparison with the Mg-free film, but the decrease is slight. The electron mobility in the films is about 5 $cm^2/V\cdot sec$, which is higher by about one digit than that of amorphous silicon. Under the same film formation conditions, both the electric conductivity and the electron mobility in the film decrease with increase of the Mg content. Therefore, the Mg content in the film is preferably more than 20 atom % and less than 85 atom % ($0.2<x<0.85$), more preferably $0.5<x<0.85$.

The amorphous film of $InGaO_3(Zn_{1-x}Mg_xO)_4$ ($0<x\leq1$) formed on a 200 μm-thick polyethylene terephthalate (PET) film in place of the glass substrate had similar characteristics.

(Formation of $In_2O_3$ Amorphous Oxide Film by PLD Process)

An $In_2O_3$ film was formed on a 200 μm-thick PET film by use of a target constituted of $In_2O_3$ polycrystalline sintered compact by a PLD process employing a KrF excimer laser.

The apparatus used is shown in FIG. 11. The substrate for the film formation was an $SiO_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was an $In_2O_3$ sintered compact (size: 20 mm diameter, 5 mm thick), which had been prepared by calcining the source material $In_2O_3$ (4N reagent) (1000° C., 2 hours), dry-crushing it, and sintering it (1550° C., 2 hours).

The final vacuum of the growth chamber was $2\times10^{-6}$ Pa, the oxygen partial pressure during the growth was 5 Pa, and the substrate temperature was 25° C.

The water vapor partial pressure was 0.1 Pa, and oxygen radicals were generated by the oxygen radical-generating assembly by application of 200 W.

The distance between the target and the film-holding substrate was 40 mm, the power of the Krf excimer laser was 0.5 $mJ/cm^2$/pulse, the pulse width was 20 nsec, the repeating frequency was 10 Hz, and the irradiation spot size was 1×1 mm square.

The film-forming rate was of 3 nm/min.

The resulting thin film was examined by small angle X-ray scattering method (SAXS) (thin film method, incidence angle: 0.5°): no clear diffraction peak was observed, which shows that the obtained In—O type oxide film was amorphous. The film thickness was 80 nm.

In the obtained In—O type amorphous oxide film, the electron carrier concentration was $5\times10^{17}/cm^3$, and the electron mobility was about 7 $cm^2/V\cdot sec$.

(Formation of In—Sn—O Type Amorphous Oxide Film by PLD Process)

An In—Sn—O type oxide film was formed on a 200 μm-thick PET film by use of a target constituted of polycrystalline sintered compact of $(In_{0.9}Sn_{0.1})O_{3.1}$ by a PLD process employing a KrF excimer laser. The apparatus used is shown in FIG. 11.

The substrate for the film formation was an $SiO_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was an $In_2O_3$—$SnO_2$ sintered compact (size: 20 mm diameter, 5 mm thick), which had been prepared by wet-mixing the source materials $In_2O_3$—$SnO_2$ (4N reagents) (solvent: ethanol), calcining the mixture (1000° C., 2 hours), dry-crushing it, and sintering it (1550° C., 2 hours).

The substrate was kept at room temperature. The oxygen partial pressure was 5 Pa. The nitrogen partial pressure was 0.1 Pa. Oxygen radicals were generated by the oxygen radical-generating assembly by application of 200 W.

The distance between the target and the film-holding substrate was 30 mm, the power of the Krf excimer laser was 1.5 mJ/cm$^2$/pulse, the pulse width was 20 nsec, the repeating frequency was 10 Hz, and the irradiation spot size was 1×1 mm square.

The film-forming rate was of 6 nm/min.

The resulting thin film was examined by small angle X-ray scattering method (SAXS) (thin film method, incidence angle: 0.5°): no clear diffraction peak was detected, which shows that the obtained In—Sn—O type oxide film is amorphous.

In the obtained In—Sn—O type amorphous oxide film, the electron carrier concentration was $8\times10^{17}/cm^3$, and the electron mobility was about 5 cm$^2$/V·sec. The film thickness was 100 nm.

(Formation of In—Ga—O Type Amorphous Oxide Film by PLD Process)

The substrate for the film was an $SiO_2$ glass substrate (Corning Co.: 1737).

As the pretreatment before the deposition, the substrate was washed ultrasonically for defatting with acetone, ethanol, and ultrapure water each for five minutes, and dried in the air at 100° C.

The target was a sintered compact of $(In_2O_3)_{1-x}$—$(Ga_2O_3)_x$ (x=0-1) (size: 20 mm diameter, 5 mm thick). For instance, at x=0.1, the target is a polycrystalline sintered compact of $(In_{0.9}Ga_{0.1})_2O_3$.

This target was prepared by wet-mixing the source materials $In_2O_3$—$Ga_2O_2$ (4N reagents) (solvent: ethanol), calcining the mixture (1000° C., 2 hours), dry-crushing it, and sintering it (1550° C., 2 hours).

The final pressure of the growth chamber was $2\times10^{-6}$ Pa. The oxygen partial pressure during the growth was 1 Pa.

The substrate was at room temperature. The distance between the target and the film-holding substrate was 30 mm. The power of the Krf excimer laser was 1.5 mJ/cm$^2$/pulse. The pulse width was 20 nsec. The repeating frequency was 10 Hz. The irradiation spot size was 1×1 mm square. The film-forming rate was of 6 nm/min.

The substrate temperature was 25° C. The oxygen pressure was 1 Pa. The resulting film was examined by small angle X-ray scattering method (SAXS) (thin film method, incidence angle: 0.5°): no clear diffraction peak was detected, which shows that the obtained In—Ga—O type oxide film is amorphous. The film thickness was 120 nm.

In the obtained In—Ga—O type amorphous oxide film, the electron carrier concentration was $8\times10^{16}/cm^3$, and the electron mobility was about 1 cm$^2$/V·sec.

(Preparation of TFT Element Having In—Zn—Ga—O Type Amorphous Oxide Film (Glass Substrate))

A top gate type TFT element shown in FIG. 5 was prepared.

Firstly, an In—Ga—Zn—O type amorphous oxide film was prepared on glass substrate 1 by the aforementioned PLS apparatus with a target constituted of a polycrystalline sintered compact having a composition of $InGaO_3(ZnO)_4$ at an oxygen partial pressure of 5 Pa. The formed In—Ga—Zn—O film had a thickness of 120 nm, and was used as channel layer 2.

Further thereon, another In—Ga—Zn—O type amorphous film having a higher electro conductivity and a gold layer were laminated, each in 30 nm thick, by the PLD method at the oxygen partial pressure of lower than 1 Pa in the chamber. Therefrom drain terminal 5 and source terminal 6 were formed by photolithography and a lift-off method.

Finally, a $Y_2O_3$ film as gate-insulating film 3 was formed by electron beam vapor deposition (thickness: 90 nm, relative dielectric constant: about 15, leakage current density: $1\times10^{-3}$ A/cm$^2$ under application of 0.5 MV/cm). Further thereon, a gold film was formed and therefrom gate terminal 4 was formed by photolithography and a lift-off method. The channel length was 50 μm, and the channel width was 200 μm.

Evaluation of Characteristics of TFT Element

FIG. 6 shows current-voltage characteristics of the TFT element at room temperature. Drain current $I_{DS}$ increased with increase of drain voltage $V_{DS}$, which shows that the channel is of an n-type conduction.

This is consistent with the fact that an amorphous In—Ga—Zn—O type semiconductor is of an n-type. The $I_{DS}$ become saturated (pinched off) at $V_{DS}$=6V, which is typical behavior of a semiconductor transistor. From examination of the gain characteristics, the threshold value of the gate voltage $V_{GS}$ under application of $V_{DS}$=4V was found to be about –0.5 V. A current flow of $I_{DS}$=1.0×10$^{-5}$ A was cased at $V_G$=10V. This corresponds to carrier induction by a gate bias in the In—Ga—Zn—O type amorphous semiconductor thin film as the insulator.

The on-off ratio of the transistor was higher than $1\times10^3$. From the output characteristics, the field effect mobility was calculated to be about 7 cm$^2$ (Vs)$^{-1}$ in the saturation region. Irradiation of visible light did not change the transistor characteristics of the produced element according to the same measurement.

The amorphous oxide of the electron carrier concentration lower than $1\times10^{18}/cm^3$ is useful as a channel layer of a TFT. The electron carrier concentration is more preferably less than $1\times10^{17}/cm^3$, still more preferably less than $1\times10^{16}/cm^3$.

(Preparation of TFT Element Having In—Zn—Ga—O type Amorphous Oxide Film (Amorphous Substrate))

A top gate type TFT element shown in FIG. 5 was prepared.

Firstly, an In—Ga—Zn—O type amorphous oxide film was prepared on polyethylene terephthalate (PET) film 1 by the aforementioned PLS apparatus with a target constituted of a polycrystalline sintered compact having a composition of $InGaO_3(ZnO)$ at an oxygen partial pressure of 5 Pa in the atmosphere. The formed film had a thickness of 120 nm, and was used as channel layer 2.

Further thereon, another In—Ga—Zn—O type amorphous film having a higher electro conductivity and a gold layer were laminated, each in 30 nm thick, by the PLD method at the oxygen partial pressure of lower than 1 Pa in the chamber. Therefrom drain terminal 5 and source terminal 6 were formed by photolithography and a lift-off method.

Finally, gate-insulating film 3 was formed by an electron beam vapor deposition method. Further thereon, a gold film was formed and therefrom gate terminal 4 was formed by photolithography and a lift-off method. The channel length was 50 μm, and the channel width was 200 μm. Three TFTs of the above structure were prepared by using respectively one of the three kinds of gate-insulating films: $Y_2O_3$ (140 nm thick), $Al_2O_3$ (130 μm thick), and $HfO_2$ (140 μm thick).

Evaluation of Characteristics of TFT Element

The TFT elements formed on a PET film had current-voltage characteristics similar to that shown in FIG. 6 at room temperature. Drain current $I_{DS}$ increased with increase of drain voltage $V_{DS}$, which shows that the channel is of an n-type conduction. This is consistent with the fact that an amorphous In—Ga—Zn—O type semiconductor is of an n type. The $I_{DS}$ become saturated (pinched off) at $V_{DS}$=6V, which is typical behavior of a semiconductor transistor. A current flow of $I_{DS}$=1.0×10$^{-8}$ A was caused at $V_G$=0 V, and a current flow of $I_{DS}$=2.0×10$^{-5}$ A was caused at $V_G$=10 V. This corresponds to carrier induction by gate bias in the insulator, the In—Ga—Zn—O type amorphous semiconductor oxide film.

The on-off ratio of the transistor was higher than 1×10$^3$. From the output characteristics, the field effect mobility was calculated to be about 7 cm$^2$ (Vs)$^{-1}$ in the saturation region.

The elements formed on the PET film were curved at a curvature radius of 30 mm, and in this state, transistor characteristics were measured. However the no change was observed in the transistor characteristics. Irradiation of visible light did not change the transistor characteristics.

The TFT employing the Al$_2$O$_3$ film as the gate-insulating film has also transistor characteristics similar to that shown in FIG. 6. A current flow of $I_{DS}$=1.0×10$^{-8}$ A was caused at $V_G$=0 V, and a current flow of $I_{DS}$=5.0×10$^{-6}$ A was caused at $V_G$=10 V. The on-off ratio of the transistor was higher than 1×10$^2$. From the output characteristics, the field effect mobility was calculated to be about 2 cm$^2$ (Vs)$^{-1}$ in the saturation region.

The TFT employing the HfO$_2$ film as the gate-insulating film has also transistor characteristics similar to that shown in FIG. 6. A current flow of $I_{DS}$=1×10$^{-8}$ A was caused at $V_G$=0 V, and a current flow of $I_{DS}$=1.0×10$^{-6}$ A was caused at $V_G$=10 V. The on-off ratio of the transistor was higher than 1×10$^2$. From the output characteristics, the field effect mobility was calculated to be about 10 cm$^2$ (Vs)$^{-1}$ in the saturation region.
(Preparation of TFT Element Employing In$_2$O$_3$ Amorphous Oxide Film by PLD Process)

A top gate type TFT element shown in FIG. 5 was prepared.

Firstly, an In$_2$O$_3$ type amorphous oxide film was formed on polyethylene terephthalate (PET) film 1 by the PLD method as channel layer 2 in a thickness of 80 nm.

Further thereon, another In$_2$O$_3$ amorphous film having a higher electro conductivity and a gold layer were laminated, each in 30 nm thick, by the PLD method at the oxygen partial pressure of lower than 1 Pa in the chamber, and at the voltage application of zero volt to the oxygen radical generating assembly. Therefrom drain terminal 5 and source terminal 6 were formed by photolithography and a lift-off method.

Finally, a Y$_2$O$_3$ film as gate-insulating film 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—O type amorphous oxide film is an n type conductor. The $I_{DS}$ become saturated (pinched off) at about $V_{DS}$=6V, which is typical behavior of a transistor. A current flow of $I_{DS}$=2×10$^{-8}$ A was caused at $V_G$=0 V, and a current flow of $I_{DS}$=2.0×10$^{-6}$ A was caused at $V_G$=10 V. This corresponds to electron carrier induction by gate bias in the insulator, the In—O type amorphous oxide film.

The on-off ratio of the transistor was about 1×10$^2$. From the output characteristics, the field effect mobility was calculated to be about 1×10 cm$^2$ (Vs)$^{-1}$ in the saturation region. The TFT element formed on a glass substrate had similar characteristics.

The elements formed on the PET film were curved in a curvature radius of 30 mm, and in this state, transistor characteristics were measured. No change was observed in the transistor characteristics.
(Preparation of TFT Element Employing In—Sn—O type Amorphous Oxide Film by PLD Process)

A top gate type TFT element shown in FIG. 5 was prepared.

Firstly, an In—Sn—O type amorphous oxide film was formed in a thickness of 100 nm as channel layer 2 on polyethylene terephthalate (PET) film 1 by the PLD method.

Further thereon, another In—Sn—O amorphous film having a higher electro conductivity and a gold layer were laminated, each in 30 nm thick, by the PLD method at the oxygen partial pressure lower than 1 Pa in the chamber, and at voltage application of zero volt to the oxygen radical generating assembly. Therefrom drain terminal 5 and source terminal 6 were formed by photolithography and a lift-off method.

Finally, a Y$_2$O$_3$ film as gate-insulating film 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—Sn—O type amorphous oxide film is an n type conductor. The $I_{DS}$ became saturated (pinched off) at about $V_{DS}$=6V, which is typical behavior of a transistor. A current flow of $I_{DS}$=5×10$^{-8}$ A was caused at $V_G$=0 V, and a current flow of $I_{DS}$=5.0×10$^{-5}$ A was caused at $V_G$=10 V. This corresponds to electron carrier induction by the gate bias in the insulator, the In—Sn—O type amorphous oxide film.

The on-off ratio of the transistor was about 1×10$^3$. From the output characteristics, the field effect mobility was calculated to be about 5 cm$^2$ (Vs)$^{-1}$ in the saturation range. The TFT element formed on a glass substrate had similar characteristics.

The elements formed on the PET film were curved at a curvature radius of 30 mm, and in this state, transistor characteristics were measured. No change was caused thereby in the transistor characteristics.
(Preparation of TFT Element Employing In—Ga—O type Amorphous Oxide Film by PLD Process)

A top gate type TFT element shown in FIG. 5 was prepared.

Firstly, an In—Ga—O type amorphous oxide film was formed in a thickness of 120 nm as channel layer 2 on polyethylene terephthalate (PET) film 1 by the PLD method shown in Example 6.

Further thereon, another In—Ga—O amorphous film having a higher conductivity and a gold layer were laminated, each in 30 nm thick, by the PLD method at the oxygen partial pressure of lower than 1 Pa in the chamber, and at the voltage application of zero volt to the oxygen radical-generating assembly. Therefrom drain terminal 5 and source terminal 6 were formed by photolithography and a lift-off method.

Finally, a Y$_2$O$_3$ film as gate-insulating film 3 was formed by an electron beam vapor deposition method. Further thereon, a gold film was formed and therefrom gate terminal 4 was formed by photolithography and a lift-off method.
Evaluation of Characteristics of TFT Element The TFT elements formed on a PET film was examined for current-voltage characteristics at room temperature. Drain current $I_{DS}$ increased with increase of drain voltage $V_{DS}$, which shows that the channel is an n-type conductor. This is consistent with the fact that an amorphous In—Ga—O type amorphous oxide film is an n type conductor. The $I_{DS}$ became saturated (pinched off) at about $V_{DS}$=6V, which is typical behavior of a transistor. A current flow of $I_{DS}$=1×10$^{-8}$ A was caused at $V_G$=0 V, and a current flow of $I_{DS}$=1.0×10$^{-6}$ A was caused at $V_G$=10 V. This corresponds to electron carrier induction by the gate bias in the insulator, the In—Ga—O type amorphous oxide film.

The on-off ratio of the transistor was about 1×10$^2$. From the output characteristics, the field effect mobility was calculated to be about 0.8 cm$^2$ (Vs)$^{-1}$ in the saturation range. The TFT element formed on a glass substrate had similar characteristics.

The elements formed on the PET film were curved at a curvature radius of 30 mm, and in this state, transistor characteristics were measured. No change was caused thereby in the transistor characteristics.

The amorphous oxide of the electron carrier concentration of lower than 1×10$^{18}$/cm$^3$ is useful as the channel layer of the TFT. The electron carrier concentration is more preferably not higher than 1×10$^{17}$/cm$^3$, still more preferably not higher than 1×10$^{16}$/cm$^3$.

Examples are described of the above embodiments. The present invention covers not only the invention of the first embodiment, but also the invention of the first embodiment combined with the second invention, and further combined with the third embodiment. The present invention is not limited to the Examples shown below in any way.

A. EXAMPLE OF FIRST INVENTION

Example 1

Preparation of Amorphous In—Ga—Zn—O Thin Film

An In—Zn—Ga—O type amorphous oxide is deposited on a glass substrate (Corning Co.: 1737) by a pulse laser vapor deposition method employing a KrF excimer laser with a polycrystalline sintered compact having a composition of InGaO$_3$(ZnO)$_4$ as the target.

With this thin film, a top gate type MISFET element as shown in FIG. 5 is prepared.

Firstly, a 40 nm-thick semi-insulating amorphous film of InGaO$_3$(ZnO)$_4$ is formed as channel layer 2 on glass substrate 1 through the above amorphous In—Ga—Zn—O thin film formation process.

Further thereon, an In$_2$O$_3$ amorphous film having a higher conductivity and a gold layer are laminated, each in 30 nm thick, by a pulse laser deposition process. Therefrom drain terminal 5 and source terminal 6 are formed by photolithography and a lift-off method.

Finally, a Y$_2$O$_3$ film as gate-insulating film 3 is formed by an electron beam vapor deposition method (thickness 100 nm, relative dielectric constant: about 15). Further thereon, a gold film was formed, and therefrom gate terminal 4 was formed by photolithography and a lift-off method.

In particular, the TFT can be made locally transparent to visible light by not conducting gold film formation at least on one of the drain electrode and the source electrode to keep there transparent. Otherwise, ITO of high conductivity may be used in formation of the source electrode, the drain electrode, or the gate electrode, and the gold film is not formed thereon. With such a constitution, TFT can be formed which is transparent in the visible light region. Such a TFT is preferred for driving on a display.

Preferably, the source electrode, the drain electrode, and the gate electrode are transparent, and the wiring for the electric connection is formed from a metal of high conductivity. In this constitution, in the vicinity to the source electrode, the drain electrode, or the gate electrode, the metal wiring is laminated on the transparent electrodes.

Example 2

Preparation of MISFET Element

In a similar manner as in Example 1, a top gate type MISFET element shown in FIG. 5 is prepared.

A 30 nm-thick semi-insulating amorphous film of InGaO$_3$(ZnO)$_4$ is formed as channel layer 2 on glass substrate 1.

Further thereon, a 40 nm-thick SnO$_2$ film having a higher electro conductivity is laminated by a pulse laser deposition process. Therefrom drain terminal 5 and source terminal 6 are formed by photolithography and a lift-off method.

Finally, a TiO$_2$ film as gate-insulating film 3 is formed by an electron beam vapor deposition method (thickness 110 nm, relative dielectric constant: about 11). Further thereon, a gold film was formed, and therefrom gate terminal 4 was formed by photolithography and a lift-off method.

Thus a device is provided which is transparent to visible light at the portions of drain terminal and the source terminal.

B. EXAMPLE OF SECOND INVENTION

Example 3

Preparation of Amorphous In—Ga—Zn—O Thin Film

An In—Zn—Ga—O type amorphous oxide is deposited on a glass substrate (Corning Co.: 1737) by a pulse laser vapor deposition method employing a KrF excimer laser with a polycrystalline sintered compact having a composition of InGaO$_3$(ZnO)$_4$ as the target.

A top gate type TFT panel is prepared through steps Shown in FIGS. 7A to 7F.

(a) On glass substrate 2700 of 12 cm×12 cm, a 120 nm-thick semi-insulating amorphous InGaO$_3$(ZnO)$_4$ film is formed for use as channel layer 2701 by the aforementioned process for forming an amorphous In—Ga—Zn—O thin film.

(b) With the substrate kept in the chamber, channel layer 2701 is covered with mask 2702, and thereon another InGaO$_3$(ZnO)$_4$ film having a higher conductivity and a gold layer are laminated, each in 30 nm thickness, by the pulse laser deposition method at the oxygen partial pressure of lower than 1 Pa in the chamber to form drain electrode 2703 and source electrode 2704. In the drawing, the InGaO$_3$(ZnO)$_4$ film and the gold film are not differentiated.

(c) With the substrate kept in the chamber, mask 2702 is removed, and a Y$_2$O$_3$ film is formed as first gate-insulating film 2705 (thickness: 10 nm, relative dielectric constant: about 15) by electron beam vapor deposition. Then an SiO$_2$ film is formed as second gate-insulating film 2706 (thickness: 80 nm, relative dielectric constant: about 3.8) by electron beam vapor deposition.

(d) The film is coated with a photo-resist, and a pattern for through hole 2707 to the drain electrode and through hole 2708 to the source electrode are formed. Then gate-insulating films 2705, 2706 are etched to form through holes 2707, 2708.

(e) Thereon Al is vapor deposited by a resistance-heating method to form conductive layer 2709 in a thickness of 100 nm.

(f) Conductive layer 2709 is patterned to form drawing-out wiring 2710 from the drain electrode, drawing-out wiring 2711 from the source electrode, and gate electrode 2712. Thereby the formation steps are completed.

Through the above steps, 100 TFTs in a 10×10 matrix having two layers of gate-insulating layer on the subject are formed in uniform intervals.

Example 4

Production of TFT Panel

A top gate type TFT panel is produced through steps of FIGS. 8A to 8F and 9G to 9L.
(a) On glass substrate 2800 of 12 cm×12 cm, a 120 nm-thick semi-insulating amorphous $InGaO_3(ZnO)_4$ film is formed for use as channel layer 2801.
(b) With the substrate kept in the chamber, a $Y_2O_3$ film is formed as first gate-insulating film 2802 (thickness: 30 nm, relative dielectric constant: about 15) by electron beam vapor deposition.
(c) The film is coated with photo resist 2803.
(d) Photo resist 2803 is patterned.
(e) First gate-insulating film 2802 is selectively etched to form opening 2804 for the drain electrode and opening 2805 for the source electrode.
(f) Another $InGaO_3(ZnO)_4$ film having a higher conductivity and a gold layer are laminated thereon, each in 30 nm thickness, by the pulse laser deposition method at the oxygen partial pressure of, for instance, lower than 1 Pa in the chamber to form first conductive layer 2806. In the drawing, the $InGaO_3(ZnO)_4$ film and the gold film are not differentiated.
(g) An unnecessary portion of the first conductive layer 2806 is lifted off.
(h) Thus drain electrode 2807 and source electrode 2808 are formed.
(i) An $SiO_2$ film is formed (thickness: 30 nm, relative dielectric constant: about 3.8) as second gate-insulating layer 2809.
(j) Second gate-insulating film 2809 is patterned to for through hole 2810 to the drain electrode and through hole 2811 to the source electrode.
(k) Thereon Al is vapor-deposited by a resistance-heating method to form second conductive layer 2812 in a thickness of 100 nm.
(l) Second conductive layer 2812 is patterned to form drawing-out wiring 2813 from the drain electrode, drawing-out wiring 2814 from the source electrode, and gate electrode 2815. Thereby the formation steps are completed.

Through the above steps, 100 TFTs in a 10×10 matrix having two layers of gate-insulating layer are formed in uniform intervals on the substrate.

By the constitution described in this Example, formation of defects such as short-circuiting of the gate are prevented, and the change with time of electric current is retarded. Therefore, the present invention enables production of TFT panels reliable and suitable for driving large-area liquid crystal panels and organic EL panels.

C. EXAMPLE OF THIRD INVENTION

Example 5

Production of Amorphous In—Ga—Zn—O Thin Film

An In—Zn—Ga—O type amorphous oxide thin film is deposited on a glass substrate (Corning Co.: 1737) by a pulse laser vapor deposition method employing a KrF excimer laser.

Figure 10:
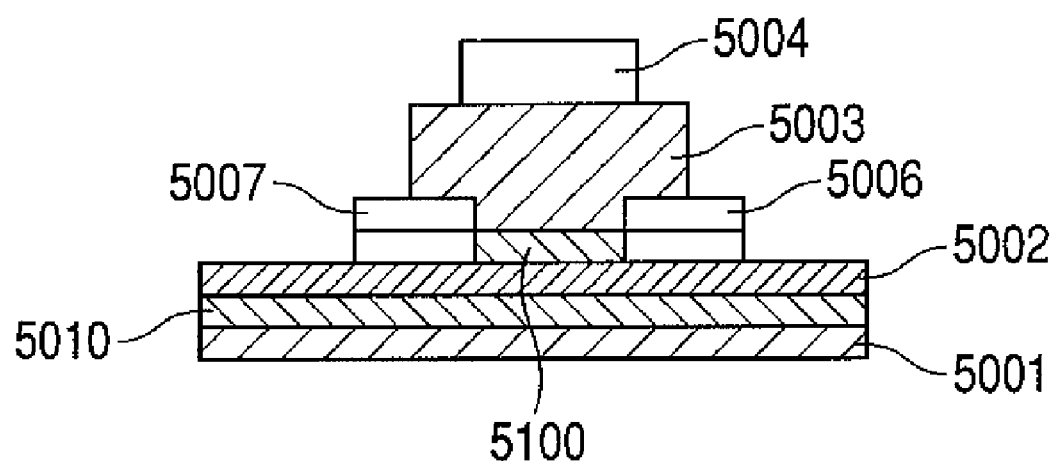
FIG. 10 illustrates schematically the structure of the top gate type MISFET element prepared in Example 1.

A top gate type MISFET element shown in FIG. 10 is prepared.

Surface-coating layer 5010 (amorphous silicon nitride layer: 300 nm) which is one of the present invention is deposited on plastic film (PET) 5001.

Thereon, a semi-insulating amorphous $InGaO_3(ZnO)_4$ film is deposited in a 35 nm thickness as channel layer 5002 by the aforementioned process for producing an amorphous In—Ga—Zn—O thin film.

Further thereon, interfacial passivation layer 5100 (amorphous silicon layer: 3 nm) which is one of the present invention is deposited.

Further, $InGaO_3(ZnO)_4$ having a conductivity higher than the above semi-insulating amorphous oxide (the above-mentioned amorphous oxide) and a gold layer are laminated thereon, each in 30 nm thickness. Drain terminal 5007 and source terminal 5006 are formed by photolithography and a lift-off method.

Finally, a $Y_2O_3$ film is formed as gate-insulating film 5003 (thickness: 70 nm, relative dielectric constant: about 15), and thereon gold film is formed and therefrom gate terminal 5004 is formed by photolithography and a lift-off method.

In the above formation of the thin films such as the surface coating layer, another material such as amorphous silicon, titanium oxide, aluminum oxide, and magnesium oxide may be used. This is preferable for improvement of adhesiveness to the substrate, decrease of roughness of substrate surface, and prevention of current leakage in the element.

In the above formation of the thin films such as the passivation layer, another material such as amorphous silicon nitride, titanium oxide, aluminum oxide, and magnesium oxide may be used. This is preferable for improvement of the gate-insulating layer, and prevention of current leakage.

In some cases, the simple passivation treatment can be sufficient. For instance, an oxygen plasma treatment ($O_2$: 5 sccm, 20 W, 20 sec) of the outermost face of the channel only is effective for improving the interface with the gate-insulating layer to prevent current leakage in the element. Preferably, after the passivation treatment, an interfacial passivation layer may be laminated additionally for prevention of current leakage in the element.

The transistor employing the transparent oxide film of the present invention is useful as a switching element for LCDs and organic EL display apparatuses. The present invention is applicable widely to flexible display devices employing a flexible material such as a plastic film, IC cards, ID tags, and so forth.

This application claims priority from Japanese Patent Application No. 2004-326683 filed Nov. 10, 2004, which is hereby incorporated by reference herein.

What is claimed is:
1. A field-effect transistor provided with a source electrode, a drain electrode, a gate insulator, a gate electrode, and a transparent channel layer, wherein
the channel layer comprises an amorphous oxide of a compound having
(a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;
(b) an electron carrier concentration of $10^{12}/cm^3$ or more and less than $10^{18}/cm^3$, wherein an electron mobility of the channel layer tends to increase with increase of the electron carrier concentration; and

(c) an oxygen defect density decreased by treatment in an atmosphere containing oxygen at a predetermined pressure during or after formation of the amorphous oxide; and at least one of the source electrode, the drain electrode and the gate electrode is transparent to visible light, wherein current between the drain electrode and the source electrode when no gate voltage is applied is less than 10 microamperes.

2. The field effect transistor according to claim 1, which has a metal wiring connected to at least one of the source electrode, the drain electrode and the gate electrode.

3. The field effect transistor according to claim 1, wherein the amorphous oxide is an oxide containing at least one of In, Zn, and Sn, or an oxide containing In, Zn, and Ga.

4. The field-effect transistor according to claim 1, wherein a metal wiring is connected to an electrode transparent to light which belongs to the source electrode, the drain electrode or the gate electrode.

5. The field-effect transistor according to claim 1, wherein the amorphous oxide is any one selected from the group consisting of an oxide containing In, Zn and Sn; an oxide containing In and Zn; an oxide containing In and Sn; and an oxide containing In.

6. A field effect transistor provided with a source electrode, a drain electrode, a gate insulator, a gate electrode, and a transparent channel layer, wherein the channel layer comprises an amorphous oxide of a compound having (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and the field-effect transistor has a lamination structure comprised of a first layer in which at least one of the source electrode, the drain electrode and the gate electrode is transparent to visible light, and a second layer composed of a metal, or the field-effect transistor has a lamination structure comprised of a first layer in which a wiring connected to at least one of the source electrode, the drain electrode and the gate electrode is transparent to visible light, and a second layer composed of a metal, wherein current between the drain electrode and the source electrode when no gate voltage is applied is less than 10 microamperes.

7. A field effect transistor provided with a source electrode, a drain electrode, a gate insulator, a gate electrode, and a transparent channel layer, wherein the channel layer comprises an amorphous oxide of a compound having (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and the gate insulator is comprised of a first layer being in contact with the amorphous oxide and a second layer different from the first layer and is laminated on the first layer, wherein current between the drain electrode and the source electrode when no gate voltage is applied is less than 10 microamperes.

8. The field effect transistor according to claim 7, wherein the first layer is an insulating layer comprising $HfO_2$, $Y_2O_3$, or a mixed crystal compound containing $HfO_2$ or $Y_2O_3$.

9. The field effect transistor according to claim 7, wherein the amorphous oxide is an oxide containing at least one of In, Zn, and Sn, or an oxide containing In, Zn, and Ga.

10. The field effect transistor according to claim 7, wherein the first layer is an interface improvement layer for improving an interfacial property with the channel layer, and the second layer is a current leakage prevention layer for preventing leakage of electric current.

11. The field-effect transistor according to claim 7, wherein the amorphous oxide is any one selected from the group consisting of an oxide containing In, Zn and Sn; an oxide containing In and Zn; an oxide containing In and Sn; and an oxide containing In.

12. A field effect transistor provided with a source electrode, a drain electrode, a gate insulator, a gate electrode, and a transparent channel layer, wherein the channel layer comprises an amorphous oxide of a compound having (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and a passivation layer is provided between the channel layer and the gate insulator, wherein current between the drain electrode and the source electrode when no gate voltage is applied is less than 10 microamperes.

13. The field effect transistor according to claim 12, wherein the amorphous oxide is an oxide containing at least one of In, Zn, and Sn, or an oxide containing In, Zn, and Ga.

14. The field effect transistor according to claim 12, wherein the passivation layer is a current leakage prevention layer for preventing leakage of electric current.

15. A field effect transistor provided with a source electrode, a drain electrode, a gate insulator, a gate electrode, and a transparent channel layer on a substrate, wherein the channel layer comprises an amorphous oxide of a compound having (a) a composition when in crystalline state represented by $In_{2-x}M3_xO_3(Zn_{1-y}M2_yO)_m$, wherein M2 is Mg or Ca; M3 is B, Al, Ga or Y; $0 \leq x \leq 2$; $0 \leq y \leq 1$; and m is zero or a natural number less than 6, or a mixture of said compounds;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and a surface-coating layer being provided between the channel layer and the substrate, wherein current between the drain electrode and the source electrode when no gate voltage is applied is less than 10 microamperes.

16. The field effect transistor according to claim 15, wherein the amorphous oxide is an oxide containing at least one of In, Zn, and Sn, or an oxide containing In, Zn, and Ga.

17. The field effect transistor according to claim 15, wherein the surface-coating layer is an adhesion-improvement layer for improving the adhesiveness between the substrate and the channel layer.

18. A field-effect transistor provided with a source electrode, a drain electrode, a gate insulator, a gate electrode, and a transparent channel layer, wherein the channel layer comprises an amorphous oxide of a compound having (a) a composition selected from an oxide containing In, Ga and Zn, an oxide containing In, Zn and Sn, an oxide containing In and Zn, an oxide containing In and Sn, or an oxide containing In;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and at least one of the source electrode, the drain electrode and the gate electrode is transparent to visible light, wherein current between the drain electrode and the source electrode when no gate voltage is applied is less than 10 microamperes.

19. A field effect transistor provided with a source electrode, a drain electrode, a gate insulator, a gate electrode, and a transparent channel layer, wherein the channel layer comprises an amorphous oxide of a compound having (a) a composition selected from an oxide containing In, Ga and Zn, an oxide containing In, Zn and Sn, an oxide containing In and Zn, an oxide containing In and Sn, or an oxide containing In;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and the field-effect transistor has a lamination structure comprised of a first layer in which at least one of the source electrode, the drain electrode and the gate electrode is transparent to visible light, and a second layer composed of a metal, or the field-effect transistor has a lamination structure comprised of a first layer in which a wiring connected to at least one of the source electrode, the drain electrode and the gate electrode is transparent to visible light, and a second layer composed of a metal, wherein current between the drain electrode and the source electrode when no gate voltage is applied is less than 10 microamperes.

20. A field effect transistor provided with a source electrode, a drain electrode, a gate insulator, a gate electrode, and a transparent channel layer, wherein the channel layer comprises an amorphous oxide of a compound having (a) a composition selected from an oxide containing In, Ga and Zn, an oxide containing In, Zn and Sn, an oxide containing In and Zn, an oxide containing In and Sn, or an oxide containing In;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and the gate insulator is comprised of a first layer being in contact with the amorphous oxide and a second layer different from the first layer and is laminated on the first layer, wherein current between the drain electrode and the source electrode when no gate voltage is applied is less than 10 microamperes.

21. A field effect transistor provided with a source electrode, a drain electrode, a gate insulator, a gate electrode, and a transparent channel layer, wherein the channel layer comprises an amorphous oxide of a compound having (a) a composition selected from an oxide containing In, Ga and Zn, an oxide containing In, Zn and Sn, an oxide containing In and Zn, an oxide containing In and Sn, or an oxide containing In;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and a passivation layer is provided between the channel layer and the gate insulator, wherein current between the drain electrode and the source electrode when no gate voltage is applied is less than 10 microamperes.

22. A field effect transistor provided with a source electrode, a drain electrode, a gate insulator, a gate electrode, and a transparent channel layer on a substrate, wherein the channel layer comprises an amorphous oxide of a compound having (a) a composition selected from an oxide containing In, Ga and Zn, an oxide containing In, Zn and Sn, an oxide containing In and Zn, an oxide containing In and Sn, or an oxide containing In;

(b) an electron carrier concentration of $10^{12}/cm^3$ or more and less than $10^{18}/cm^3$, wherein an electron mobility of the channel layer tends to increase with increase of the electron carrier concentration; and (c) an oxygen defect density decreased by treatment in an atmosphere containing oxygen at a predetermined pressure during or after formation of the amorphous oxide; and a surface-coating layer is provided between the channel layer and the substrate, wherein current between the drain electrode and the source electrode when no gate voltage is applied is less than 10 microamperes.

23. The field effect transistor according to any one of claim 1, 6, 7, 12, 15, 18, 19, 20, 21 or 22, wherein the amorphous oxide is an oxide which exhibits a halo pattern and no characteristic diffraction line in an X-ray diffraction spectrometry.

24. The field effect transistor according to any one of claim 1, 6, 7, 12, 15, 18, 19, 20, 21 or 22, wherein the amorphous oxide has an electron carrier concentration of less than $10^{16}/cm^3$.

* * * * *